(12) United States Patent
Kim et al.

(10) Patent No.: US 12,472,596 B2
(45) Date of Patent: Nov. 18, 2025

(54) SUPPORT UNIT AND SUBSTRATE TREATING APPARATUS INCLUDING THE SAME

(71) Applicant: SEMES CO., LTD., Cheonan-si (KR)

(72) Inventors: Kang Sul Kim, Hwaseong-si (KR); Hee Man Ahn, Seoul (KR)

(73) Assignee: SEMES CO., LTD., Chungcheongnam-do (KR)

( * ) Notice: Subject to any disclaimer, the term of this patent is extended or adjusted under 35 U.S.C. 154(b) by 509 days.

(21) Appl. No.: 17/862,601

(22) Filed: Jul. 12, 2022

(65) Prior Publication Data
US 2023/0014205 A1    Jan. 19, 2023

(30) Foreign Application Priority Data
Jul. 19, 2021  (KR) ........................ 10-2021-0094415

(51) Int. Cl.
*H01L 21/683* (2006.01)
*B23Q 3/06* (2006.01)
(Continued)

(52) U.S. Cl.
CPC ............. *B23Q 3/088* (2013.01); *B23Q 3/062* (2013.01); *B23Q 2703/04* (2013.01); *H01L 21/68735* (2013.01)

(58) Field of Classification Search
CPC ........... H01L 21/6838; H01L 21/68785; H01L 21/6875; H01L 21/67098; H01L 21/67103;
(Continued)

(56) References Cited

U.S. PATENT DOCUMENTS 9,517,539 B2 * 12/2016 Lin .......................... B23Q 3/18
10,755,959 B2 * 8/2020 Iwabuchi ............ H01L 21/6875
(Continued)

FOREIGN PATENT DOCUMENTS

CN  203542342 U  *  4/2014
CN  106653671 A  *  5/2017  ......... H01L 21/6838
(Continued)

OTHER PUBLICATIONS

Adsorption Rotating Device And Single-piece Wafer Cleaning Machine; Document ID: CN 114558839 A; Date Published: May 31, 2022; Inventor: Zhao Tian-xiang, Gu Xue-ping, Cai,Chao; Application No. CN 202210121006 A; Date Filed: Feb. 9, 2022 (Year: 2022).*

(Continued)

*Primary Examiner* — Mahdi H Nejad
(74) *Attorney, Agent, or Firm* — Harness, Dickey & Pierce, P.L.C.

(57) ABSTRACT

The present invention provides a substrate treating apparatus, including: a treatment container having a treatment space therein; a support unit for supporting and rotating the substrate in the treatment space; and a liquid supply unit for supplying a liquid onto the substrate, in which wherein the support unit includes: a body on which the substrate is seated; and a support shaft coupled to the body, and an upper surface of the body is provided with a central portion including a center of the body and an edge portion surrounding the central portion, and a vacuum hole is formed in the central portion, and a groove is formed in the edge portion.

18 Claims, 12 Drawing Sheets

(51) Int. Cl.
  *B23Q 3/08* (2006.01)
  *H01L 21/67* (2006.01)
  *H01L 21/687* (2006.01)

(58) Field of Classification Search
  CPC ......... H01L 21/67109; H01L 21/68735; H01L 21/67126; H01L 21/68742; B25B 11/005
  See application file for complete search history.

(56) References Cited

U.S. PATENT DOCUMENTS

| | | | |
|---|---|---|---|
| 11,476,151 B2 * | 10/2022 | Ji | ...................... H01L 21/67103 |
| 11,495,483 B2 * | 11/2022 | Parimi | ................ H01L 21/6831 |
| 11,538,696 B2 * | 12/2022 | Koo | .................... H01L 21/6719 |
| 12,308,278 B1 * | 5/2025 | Levin | ................ H01L 21/68785 |
| 2007/0218664 A1 * | 9/2007 | Ito | ........................... C30B 25/12 |
| | | | 438/565 |
| 2009/0079122 A1 * | 3/2009 | Obweger | .......... H01L 21/67051 |
| | | | 269/57 |
| 2022/0380895 A1 * | 12/2022 | Singu | ................ H01L 21/67248 |

FOREIGN PATENT DOCUMENTS

| | | | | | |
|---|---|---|---|---|---|
| CN | 116153834 | A | * | 5/2023 | ....... H01L 21/67353 |
| CN | 116705686 | A | * | 9/2023 | |
| CN | 117672946 | A | * | 3/2024 | |
| CN | 118448330 | A | * | 8/2024 | |
| JP | 9-66429 | A | | 3/1997 | |
| JP | 2615317 | B2 | * | 5/1997 | |
| JP | 11-274280 | A | | 10/1999 | |
| JP | 2001070859 | A | * | 3/2001 | |
| JP | 2003-001182 | A | | 1/2003 | |
| JP | 2012-119591 | | | 6/2012 | |
| JP | 2015-138859 | A | | 7/2015 | |
| JP | 2020-188035 | A | | 11/2020 | |
| KR | 20210021698 | A | * | 8/2019 | |
| KR | 102183286 | B1 | | 11/2020 | |
| KR | 10-2021-0033420 | A | | 3/2021 | |
| WO | WO-2014/034504 | A1 | | 3/2014 | |
| WO | WO-2015064613 | A1 | | 5/2015 | |

OTHER PUBLICATIONS

Substrate Stage and Substrate Processing Device Provided With Same; Document ID: WO 2014034504 A1; Inventor: Harada Yoshinori; Application No. JP 2013072344 W; Date Filed: Aug. 22, 2013 (Year: 2014).*

Japanese Office Action, dated Aug. 22, 2023, issued in corresponding Japanese Patent Application No. 2022-113807.

* cited by examiner

SUPPORT UNIT AND SUBSTRATE TREATING APPARATUS INCLUDING THE SAME

CROSS-REFERENCE TO RELATED APPLICATIONS

This application claims priority to and the benefit of Korean Patent Application No. 10-2021-0094415 filed in the Korean Intellectual Property Office on Jul. 19, 2021, the entire contents of which are incorporated herein by reference.

TECHNICAL FIELD

The present invention relates to a support unit and an apparatus for treating a substrate including the same, and more particularly, to a substrate treating apparatus for treating a substrate by supplying a liquid to a rotating substrate, and a support unit used therein.

BACKGROUND ART

In order to manufacture a semiconductor device, various processes, such as cleaning, deposition, photography, etching, and ion implantation, are performed. Among these processes, the photography process includes a coating process of forming a film by applying a photosensitive liquid, such as a photoresist, to a surface of a substrate, an exposure process of transferring a circuit pattern to a film formed on the substrate, and a developing process for selectively removing a film formed on a substrate in a region on which the exposure treatment has been performed and an opposite region thereof.

In the recent trend of multi-layering, fine patterning, and larger substrates, a warpage phenomenon is induced in the substrate. For example, in the etching process, a difference in a Critical Dimension (CD) of a pattern is induced due to mutual attraction between impurities or stacked materials induced while etching a pattern target film having different etch rates, and the patterns are tilted to cause warpage of the substrate. As another example, when the semiconductor substrate is multi-layered, a pressure difference is generated between the respective layers, thereby causing warpage of one side of the substrate. In addition, warpage occurs in the substrate under the influence of various pretreatment processes, such as film formation on the substrate. The warpage of the substrate increases the process defect rate when a subsequent unit process is performed. In particular, a problem arises when a coating process and a developing process of supplying a treatment liquid onto the substrate while rotating the substrate supported by a support unit are performed.

When the substrate W in the warped state is seated on the support unit, a phenomenon that the vicinity of an edge of a body of the support unit and the substrate are spaced apart from each other by a predetermined distance. By forming the space between the substrate and the edge region of the body of the support unit, an external air flow is introduced into the space. When the support unit adsorbs and fixes the substrate in a vacuum adsorption method, the intensity of the negative pressure is relatively large at the center of the support unit, and the intensity of the negative pressure is relatively small at the edge of the support unit. For this reason, the adsorption and fixation of the substrate by the support unit is not smooth. Furthermore, due to the deviation of the relative pressure between the central portion and the edge portion of the substrate, a problem of strengthening the warpage of the substrate is caused. This prevents the treatment liquid from being uniformly coated on the substrate in the coating process and the developing process.

SUMMARY OF THE INVENTION

The present invention has been made in an effort to provide a support unit capable of minimizing an influence of external airflow and a substrate treating apparatus including the same.

The present invention has also been made in an effort to provide a support unit capable of minimizing variations in pressure transmitted to a substrate seated on the support unit, and a substrate treating apparatus including the same.

The object of the present invention is not limited thereto, and other objects not mentioned will be clearly understood by those of ordinary skill in the art from the following description.

An exemplary embodiment of the present invention provides a substrate treating apparatus, including: a treatment container having a treatment space therein; a support unit for supporting and rotating the substrate in the treatment space; and a liquid supply unit for supplying a liquid onto the substrate, in which wherein the support unit includes: a body on which the substrate is seated; and a support shaft coupled to the body, and an upper surface of the body is provided with a central portion including a center of the body and an edge portion surrounding the central portion, and a vacuum hole is formed in the central portion, and a groove is formed in the edge portion.

According to the exemplary embodiment, the groove may be provided in a slit shape.

According to the exemplary embodiment, the slit may be provided in a ring shape along a circumference of the edge portion.

According to the exemplary embodiment, the slit may be provided with a first side surface and a second side surface located farther from the center of the body than the first side surface when viewed from a cross-section cut in a width direction of the slit.

According to the exemplary embodiment, the first side surface and the second side surface may be formed parallel to an axial direction of the support shaft.

According to the exemplary embodiment, the first side surface may be formed parallel to an axial direction of the support shaft, and the second side surface may be formed to be inclined upwardly in a direction away from the axial direction of the support shaft.

According to the exemplary embodiment, in the slit, a protrusion protruding in a direction away from the center may be formed on an upper portion of the first side surface.

According to the exemplary embodiment, the upper surface may be provided with a smaller area than the substrate when viewed from the top, an upper surface of the central portion may be formed lower than an upper surface of the edge portion, a support protrusion for supporting the substrate may be provided on the upper surface of the central portion, and the upper surface of the edge portion and an upper end of the support protrusion may be provided at the same height.

According to the exemplary embodiment, a portion surrounded by the edge portion may be provided as a decompression space in which the substrate is adsorbed by the vacuum hole, and an inner space of the groove may be provided as an airflow trapping space in which an external airflow introduced between the substrate and the upper surface of the edge portion stays.

According to the exemplary embodiment, a plurality of the slits may be provided while being spaced apart from each other in a direction to the central portion in the edge portion, and the plurality of slits may be provided in different shapes from each other.

According to the exemplary embodiment, the slit may have any one of a first shape in which the first side surface and the second side surface are formed parallel to an axial direction of the support shaft; a second shape in which the first side surface is formed parallel to the axial direction of the support shaft, and the second side is inclined upwardly in a direction away from the axial direction of the support shaft; a third shape in which the first side surface and the second side surface are formed parallel to the axial direction of the support shaft, and a protrusion that protrudes in a direction away from the center of the support shaft and is provided on an upper end of the first side surface is further formed; and a fourth shape in which the first side surface is formed parallel to the axial direction of the support shaft, and the second side surface is formed to be inclined upwardly in a direction away from the axial direction of the support shaft, and a protrusion that protrudes in a direction away from the center of the support shaft and is provided on the upper end of the first side surface is further formed.

Another exemplary embodiment of the present invention provides a support unit for supporting and rotating a substrate, the support unit including: a body on which a substrate is seated; and a support shaft coupled to the body and formed with a vacuum flow path therein, in which an upper surface of the body is provided with a central portion including a center of the body and an edge portion surrounding the central portion, a vacuum hole communicating with one end of the vacuum flow path is formed in a center of the central portion, and a ring-shaped slit is formed along a circumference of the edge portion, and the slit is provided with a first side surface and a second side surface located farther from the center of the body than the first side surface when viewed from a cross-section cut in a width direction of the slit.

According to the exemplary embodiment, the first side surface and the second side surface may be formed parallel to an axial direction of the support shaft.

According to the exemplary embodiment, the first side surface may be formed parallel to an axial direction of the support shaft, and the second side surface may be formed to be inclined upwardly in a direction away from the axial direction of the support shaft.

According to the exemplary embodiment, in the slit, a protrusion protruding in a direction away from the center may be formed on an upper portion of the first side surface.

According to the exemplary embodiment, the upper surface may be provided with a smaller area than the substrate when viewed from the top.

According to the exemplary embodiment, an upper surface of the central portion may be formed lower than an upper surface of the edge portion and provided with a support protrusion supporting the substrate, and the upper surface of the edge portion and an upper end of the support protrusion may be provided at the same height with respect to the ground.

According to the exemplary embodiment, a plurality of the slits may be provided while being spaced apart from each other in a direction to the central portion in the edge portion, and the plurality of slits may be provided in different shapes from each other.

Still another exemplary embodiment of the present invention provides a substrate treating apparatus, including: a housing having an inner space; a treatment container positioned within the inner space and having a treatment space; a support unit for supporting and rotating the substrate in the treatment space; a liquid supply unit for supplying a liquid onto the substrate; and an airflow supply unit coupled to an upper surface of the housing and supplying gas forming a downward airflow to the inner space, in which the support unit includes: a body on which a substrate is seated; and a support shaft coupled to the body and formed with a vacuum flow path therein, and an upper surface of the body is provided with a central portion including a center of the body and an edge portion surrounding the central portion, a vacuum hole communicating with one end of the vacuum flow path is formed in a center of the central portion, an upper surface of the central portion is formed lower than an upper surface of the edge portion and is provided with a support protrusion supporting the substrate, a ring-shaped slit is formed along a circumference of the edge portion, and the slit is provided with a first side surface and a second side surface located farther from the center of the body than the first side surface when viewed from a cross-section cut in a width direction of the slit.

According to the exemplary embodiment, in the slit, a protrusion protruding in a direction away from the center may be formed on an upper portion of the first side surface.

According to the exemplary embodiment of the present invention, it is possible to improve efficiency of a liquid treatment process.

Further, according to the exemplary embodiment of the present invention, it is possible to minimize the influence of the external air flow transmitted to the support unit.

Further, according to the exemplary embodiment of the present invention, it is possible to minimize the deviation of the pressure transmitted to the substrate seated on the support unit.

Further, according to the exemplary embodiment of the present invention, it is possible to minimize deterioration of the warped state of the substrate when the substrate in the warped state is supported on the support unit.

The effect of the present invention is not limited to the foregoing effects, and those skilled in the art may clearly understand non-mentioned effects from the present specification and the accompanying drawings.

DETAILED DESCRIPTION

Figure 1:
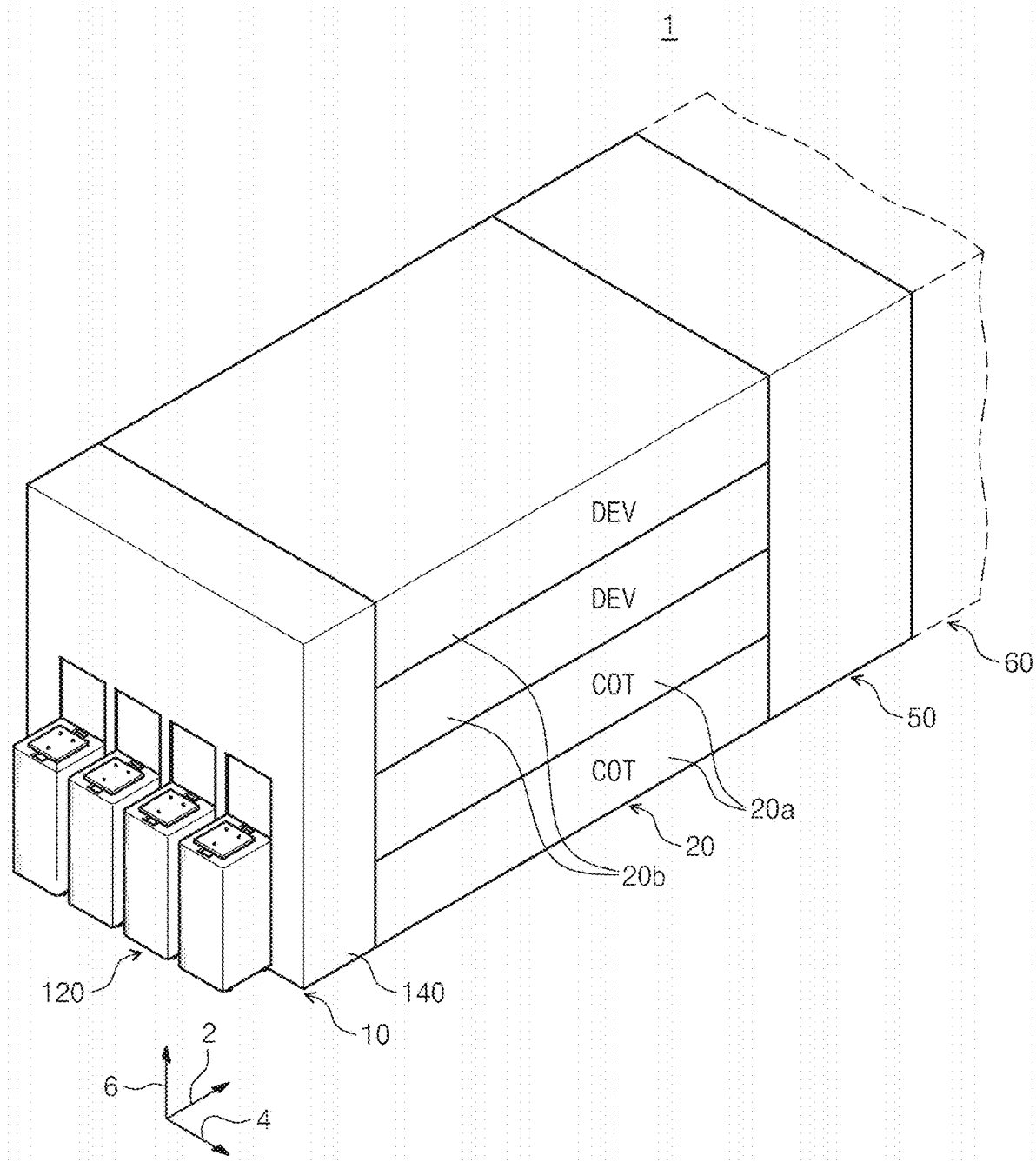
FIG. 1 is a perspective view schematically illustrating a substrate treating apparatus according to an exemplary embodiment of the present invention.

Hereinafter, an exemplary embodiment of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

Hereinafter, an example of the present invention will be described in detail with reference to FIGS. 1 to 17. In the following exemplary embodiment, an apparatus for coating a photoresist on a substrate and developing the substrate after exposure will be described as an example of a substrate treating apparatus. However, the present invention is not limited thereto, and may be applied to various types of apparatuses for treating a substrate by supplying a liquid to a rotating substrate. For example, the substrate treating apparatus may be an apparatus that performs a process of removing foreign substances from the substrate by supplying a cleaning liquid to the substrate, or removing a thin film from the substrate by supplying a chemical liquid to the substrate.

Figure 2:
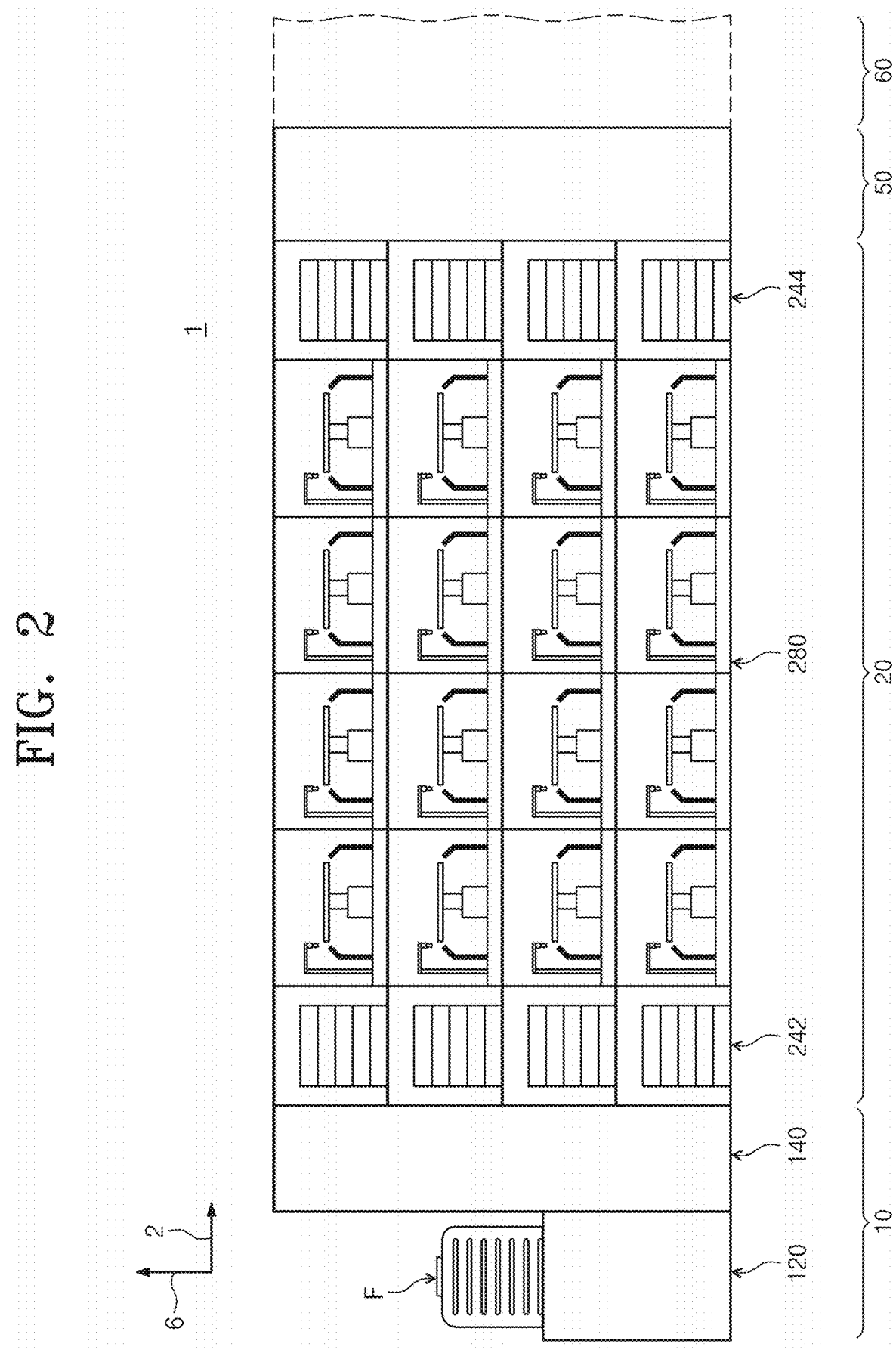
FIG. 2 is a front view of the substrate treating apparatus illustrating a coating block or a he developing block of FIG. 1.
Figure 3:
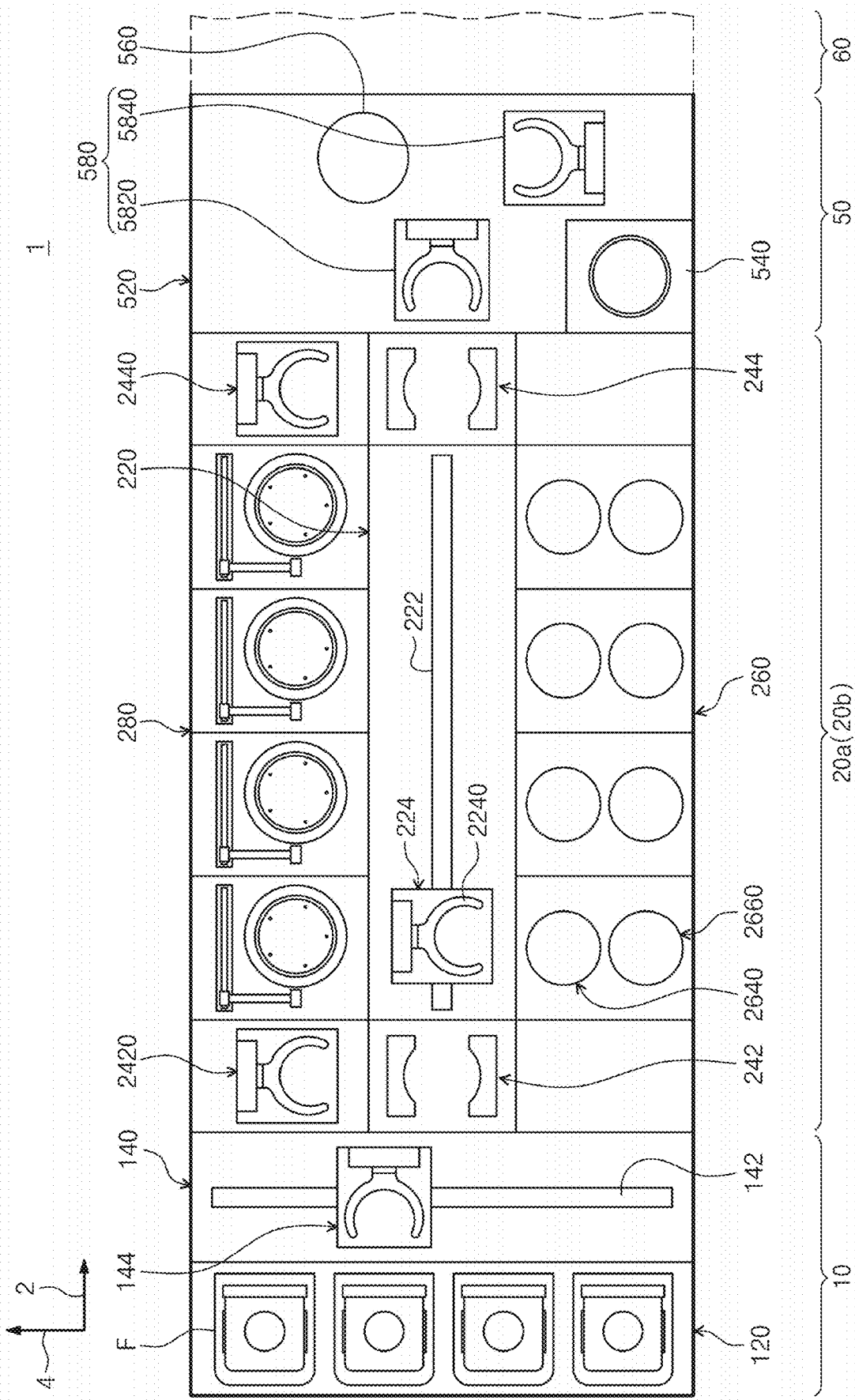
FIG. 3 is a top plan view of the substrate treating apparatus of FIG. 1.

FIG. 1 is a perspective view schematically illustrating a substrate treating apparatus according to an exemplary embodiment of the present invention, and FIG. 2 is a front view of the substrate treating apparatus illustrating a coating block or a he developing block of FIG. 1. FIG. 3 is a top plan view of the substrate treating apparatus of FIG. 1.

Referring to FIGS. 1 to 3, a substrate treating apparatus 1 includes an index module 10, a treating module 20, and an interface module 30. According to the exemplary embodiment, the index module 10, the treating module 20, and the interface module 30 are sequentially arranged in a line. Hereinafter, a direction in which the index module 10, the treating module 20, and the interface module 30 are arranged is defined as a first direction 2, a direction perpendicular to the first direction 2 when viewed from the top is defined as a second direction 4, and a direction perpendicular to the plane including both the first direction 2 and the second direction 4 is defined as a third direction 6.

The index module 10 transfers a substrate W to the treating module 20 which treats a substrate W from a container F in which the substrate W is accommodated. The index module 10 accommodates the substrate W that has been completely treated in the treating module 20 into the container F. A longitudinal direction of the index module 10 is the second direction 4. The index module 10 includes a load port 110 and an index frame 140.

The container F in which the substrate W is accommodated is seated in the load port 120. The load port 120 is located at an opposite side of the treating module 20 based on the index module 140. A plurality of load ports 120 may be provided, and the plurality of load ports 120 may be arranged in a line along the second direction 4. The number of load ports 120 may be increased or decreased according to process efficiency of the treating module 20 and a condition of foot print, and the like.

A plurality of slots (not illustrated) for accommodating the plurality of substrates W in a state where the substrates W are arranged horizontally with respect to the ground may be formed in the container F. As the container F, a sealing container, such as a Front Opening Unified Pod (FOUP), may be used. The container F may be placed on the load port 120 by a transfer means (not illustrated), such as an overhead transfer, an overhead conveyor, or an automatic guided vehicle, or an operator.

An index rail 142 and an index robot 144 are provided inside the index frame 140. The index rail 142 is provided inside the index frame 140 so that a longitudinal direction is the second direction 4. The index robot 144 may transfer the substrate W. The index robot 144 may transfer the substrate W between the index module 10 and a buffer chamber 240 to be described later. The index robot 144 may include an index hand 1440. The substrate W may be placed on the index hand 1440. The index hand 1440 may include an index base 1442 having an annular ring shape in which a part of a circumference is symmetrically bent, and an index support part 1444 that moves the index base 1442. The configuration of the index hand 1440 is the same as or similar to that of a transfer hand 2240, which will be described later. The index hand 1440 may be provided to be movable in the second direction 4 on the index rail 142. Therefore, the index hand 1440 is movable forward and backward along the index rail 142. Further, the index hand 1440 may be provided to be rotatable about the third direction 6 and be movable in the third direction 6.

The treating module 20 may receive the substrate W accommodated in the container F and perform a coating process and a developing process on the substrate W. The treating module 20 includes a coating block 20a and a developing block 20b. The coating block 20a performs a coating process on the substrate W. The developing block 20b performs a developing process on the substrate W. A plurality of coating blocks 20a are provided, and the coating blocks 20a are provided to be stacked on each other. A plurality of developing blocks 20b are provided, and the developing blocks 20b are provided to be stacked on each other. According to the exemplary embodiment of FIG. 3, two coating blocks 20a are provided, and two developing blocks 20b are provided. The coating blocks 20a may be disposed below the developing blocks 20b. According to an example, the two coating blocks 20a perform the same process, and may be provided in the same structure. Also, the two developing blocks 20b may perform the same process as each other, and may be provided in the same structure.

Referring to FIG. 3, the coating block 20a includes a transfer chamber 220, the buffer chamber 240, a heat treating chamber 260, and a liquid treating chamber 280. The transfer chamber 220 provides spaces for transferring the substrate W between the buffer chamber 240 and the heat treating chamber 260, between the buffer chamber 240 and the liquid treating chamber 280, and between the heat treating chamber 260 and the liquid treating chamber 280. The buffer chamber 240 provides a space in which the substrate W loaded into the coating block 20a and the substrate W unloaded from the coating block 20a temporarily stay. The heat treating chamber 260 performs a heat treatment process on the substrate W. The heat treatment process may include a cooling process and a heating process. The liquid treating chamber 260 supplies a liquid on the substrate W to form a liquid film. The liquid film may be a photoresist film or an antireflection film.

A longitudinal direction of the transfer chamber 220 may be provided in the first direction 2. The transfer chamber 220 is provided with a guide rail 222 and a transfer robot 224. The guide rail 222 is provided in the transfer chamber 220 so that a longitudinal direction is the first direction 2. The transfer robot 244 may be provided to be linearly movable in the first direction 2 on the guide rail 222. The transfer robot 224 transfers the substrate between the buffer chamber 240 and the heat treating chamber 260, between the buffer chamber 240 and the liquid treating chamber 280, and between the heat treating chamber 260 and the liquid treating chamber 280.

According to an example, the transfer robot 224 has a transfer hand 2240 on which the substrate W is placed. The transfer hand 2240 may be provided to be movable forward and backward, rotatable about the third direction 6, and movable along the third direction 6.

Figure 4:
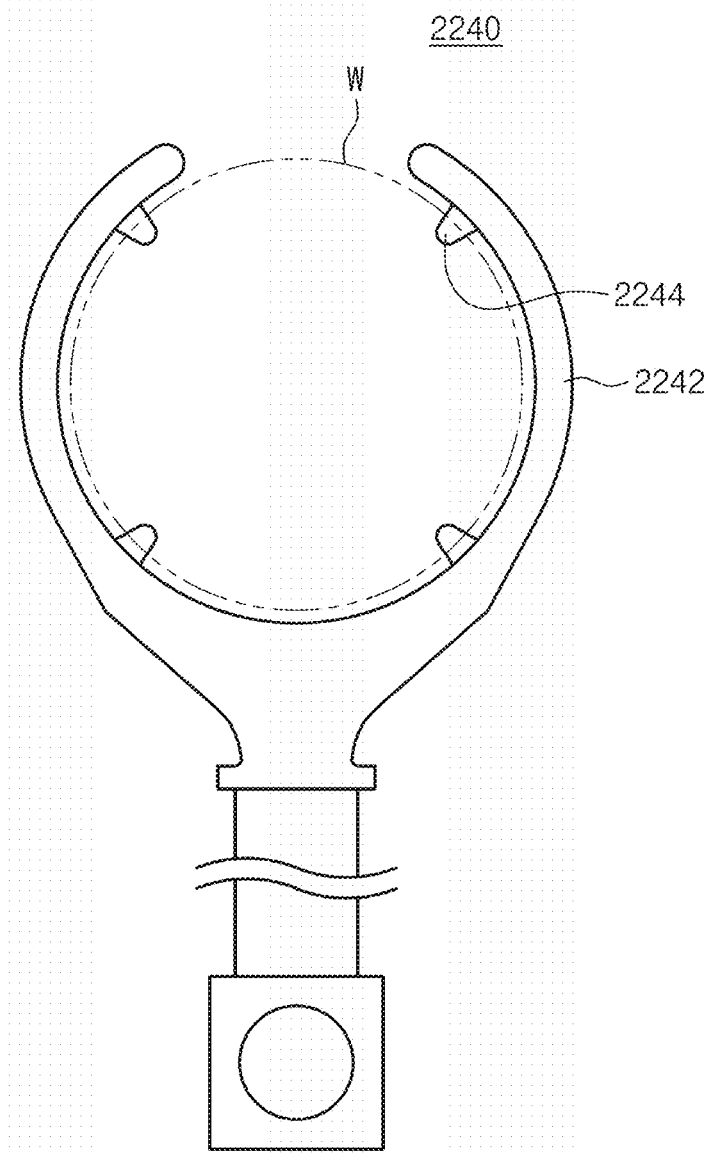
FIG. 4 is a diagram illustrating an example of a hand provided in a transfer chamber of FIG. 3.

FIG. 4 is a diagram illustrating an example of the transfer hand provided in the transfer chamber of FIG. 3. Referring to FIG. 4, the transfer hand 2240 has a base 2242 and a support protrusion 2244. The base 2242 may have an annular ring shape in which a portion of the circumference is bent. The base 2242 may have a ring shape in which a portion of the circumference is symmetrically bent. The base 2242 has an inner diameter larger than a diameter of the substrate W. The support protrusion 2244 extends inwardly from the base 2242. A plurality of support protrusions 2244 are provided, and supports an edge region of the substrate W. According to an example, four support protrusions 2244 may be provided at equal intervals.

Referring back to FIGS. 2 and 3, a plurality of buffer chambers 240 is provided. Some of the buffer chambers 240 are disposed between the index module 10 and the transfer chamber 220. Hereinafter, the foregoing buffer chambers are referred to as front buffers 242. A plurality of front buffers 242 are provided, and are located to be stacked on each other in the vertical direction. Another portion of the buffer chambers 240 is disposed between the transfer chamber 220 and the interface module 30. Hereinafter, the foregoing buffer chambers are referred to as rear buffers 244. A plurality of rear buffers 244 are provided, and are located to be stacked on each other in the vertical direction. Each of the front buffers 242 and the rear buffers 244 temporarily stores a plurality of substrates W. The substrate W stored in the front buffer 242 is loaded or unloaded by the index robot 144 and the transfer robot 224. The substrate W stored in the rear buffer 244 is loaded or unloaded by the transfer robot 224 and a first robot 3820 which is to be described later.

Buffer robots 2420 and 2440 may be provided on one side of the buffer chamber 240. The buffer robots 2420 and 2440 may include a front buffer robot 2420 and a rear buffer robot 2440. The front buffer robot 2420 may be provided on one side of the front buffer 242. The rear buffer robot 2440 may be provided on one side of the rear buffer 244. The present invention is not limited thereto, and the buffer robots 2420 and 2440 may be provided on both sides of the buffer chamber 240.

The front buffer robot 2420 may transfer the substrate W between the front buffers 242. The front buffer robot 2420 may include a front buffer hand 2422. The front buffer hand 2422 may be moved up and down along the third direction 6. The front buffer hand 2422 may be rotated. The front buffer hand 2422 may transfer the substrate W. The front buffer hand 2422 may load or unload the substrate W to pins 2486 provided on a support plate 2482 which is to be described later. The rear buffer robot 2440 may transfer the substrate W between the rear buffers 244. The rear buffer robot 2440 may include a rear end buffer hand 2442. The configuration of the rear buffer hand 2442 is the same as or similar to that of the front buffer hand 2422. Therefore, a description of the rear buffer hand 2442 will be omitted.

Figure 5:
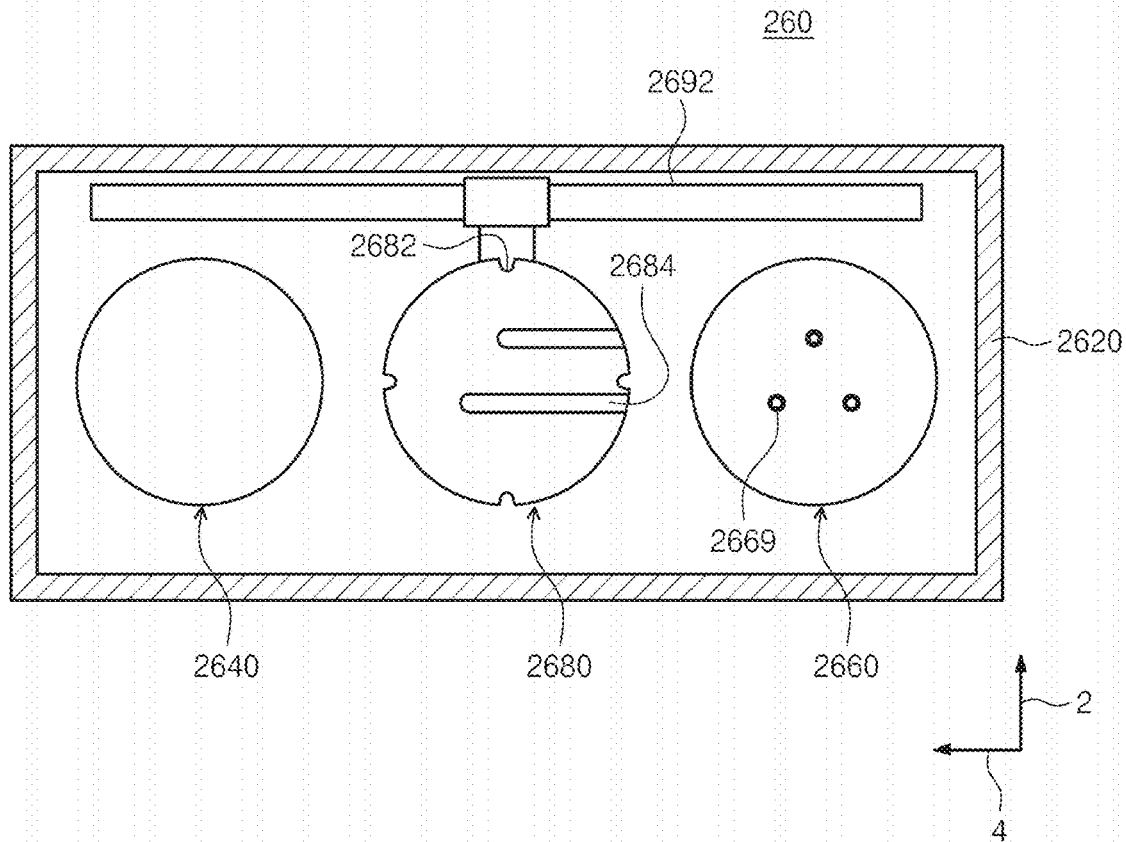
FIG. 5 is a top plan view schematically illustrating an example of a heat treating chamber of FIG. 3.
Figure 6:
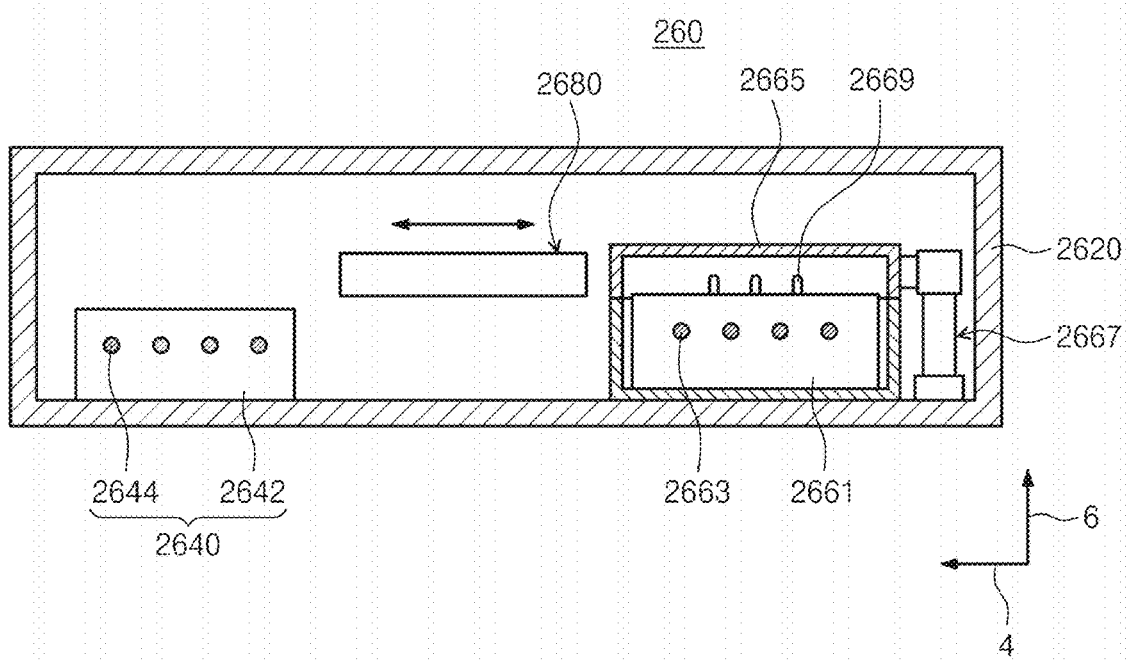
FIG. 6 is a front view of the heat treating chamber of FIG. 5.

FIG. 5 is a top plan view schematically illustrating an example of a heat treating chamber of FIG. 3, and FIG. 6 is a front view of the heat treating chamber of FIG. 5. Referring to FIGS. 5 and 6, a plurality of heat treating chambers 260 are provided. The heat treatment chambers 260 are disposed along the first direction 2. The heat treatment chambers 260 are located at one side of the transfer chamber 220. The heat treatment chamber 260 includes a housing 2620, a cooling unit 2640, a heating unit 2660, and a transfer plate 2680.

The housing 2620 is provided in the shape of a generally rectangular parallelepiped. The housing 2620 provides space therein. An entrance (not illustrated) through which the substrate W enters and exits is formed on a side wall of the housing 2620. The entrance may remain open. A door (not illustrated) may be provided to selectively open and close the entrance.

A cooling unit 2640, a heating unit 2660, and a conveying plate 2680 are provided in the inner space of the housing 2620. The cooling unit 2640 and the heating unit 2660 are provided side by side along the second direction 4. According to an example, the cooling unit 2640 may be located relatively closer to the transfer chamber 220 than the heating unit 2660. The cooling unit 2640 includes a cooling plate 2642. The cooling plate 2642 may have a generally circular shape when viewed from the top. The cooling plate 2642 is provided with a cooling member 2644. According to an example, the cooling member 2644 is formed inside the cooling plate 2642 and may be provided as a flow path through which a cooling fluid flows.

The heating unit 2660 provided in some of the heat treating chambers 260 may supply gas while heating the substrate W to improve the adhesion rate of the photoresist to the substrate W. According to an example, the gas may be hexamethyldisilane (HMDS) gas.

The heating unit 2660 includes a heating plate 2661, a heater 2663, a cover 2665, and a driver 2667. The heating plate 2661 has a generally circular shape when viewed from the top. The heating plate 2661 has a larger diameter than that of the substrate W. A heater 2663 is installed in the heating plate 2661. The heater 3233 may be provided as a heating resistor to which current is applied.

The heating plate 2661 is provided with lift pins 2669 drivable in the vertical direction along the third direction 6. The lift pin 2669 receives the substrate W from a transfer means outside the heating unit 2660 and places the received substrate W down on the heating plate 2661 or lifts the substrate W from the heating plate 2661 and hands over the substrate W to the transfer means outside the heating unit 2660. According to an example, three lift pins 2669 may be provided.

The cover 2665 has a space with an open lower portion therein. The cover 2665 is located above the heating plate 2661 and is moved up and down by the driver 2667. A space formed by the cover 2665 and the heating plate 2661 according to the movement of the cover 2665 is provided as a heating space for heating the substrate W.

The transport plate 2680 is provided in a substantially disk shape and has a diameter corresponding to that of the substrate W. A notch 2682 is formed at the edge of the transfer plate 2680. The notches 2682 are provided in a number corresponding to that of the support protrusions 2244 formed on the transfer hand 2240 of the transfer robot 224, and are formed at positions corresponding to those of the support protrusions 2244. When the upper and lower positions of the transfer hand 2240 and the transfer plate 2680 are changed in positions where the transfer hand 2240 and the transfer plate 2680 are vertically aligned, the substrate W is transferred between the transfer hand 2240 and the transfer plate 2680. The transfer plate 2680 is mounted on the guide rail 2692, and is movable between a first area 2696 and a second area 2698 along the guide rail 2692 by the driver 2694.

A plurality of slit-shaped guide grooves 2680 is provided in the transfer plate 2684. The guide groove 2684 extends from the end of the transfer plate 2680 to the inside of the transfer plate 2680. A longitudinal direction of the guide grooves 2684 is provided along the second direction 4, and the guide grooves 2684 are located while being spaced apart from each other along the first direction 2. The guide groove 2684 prevents the transfer plate 2680 and the lift pins 2669 from interfering with each other when the substrate W is transferred between the transfer plate 2680 and the heating unit 2660.

Cooling of the substrate W is performed in a state in which the transfer plate 2680 on which the substrate W is placed is in contact with the cooling plate 2642. The transfer plate 2680 is made of a material having high thermal conductivity so that heat transfer is well performed between the cooling plate 2642 and the substrate W. According to an example, the transfer plate 2680 may be made of a metal material.

Referring back to FIGS. 2 and 3, a plurality of liquid treating chambers 280 are provided. Some of the liquid treating chambers 360 may be provided to be stacked on each other. The liquid treating chambers 360 are disposed at one side of the transfer chamber 220. The liquid treating chambers 280 are arranged side by side along the first direction 2. Some of the liquid treating chambers 360 are provided at positions adjacent to the index module 10. Hereinafter, the liquid treating chambers 360 are referred to as front liquid treating chambers 280. Another some of the liquid treating chambers 360 are provided at positions adjacent to the interface module 30. Hereinafter, the liquid treating chambers 360 are referred to as rear liquid treating chambers 280.

The front liquid treating chamber 282 applies a first liquid on the substrate W, and the rear liquid treating chamber 284 applies a second liquid on the substrate W. The first liquid and the second liquid may be different types of liquid. According to the exemplary embodiment, the first liquid is an anti-reflection film, and the second liquid is a photoresist. The photoresist may be applied on the substrate W on which the anti-reflection film is applied. Optionally, the first liquid may be a photoresist, and the second liquid may be an anti-reflection film. In this case, the anti-reflection film may be applied on the substrate W on which the photoresist is applied. Optionally, the first liquid and the second liquid are the same type of liquid, and both may be a photoresist.

Figure 7:
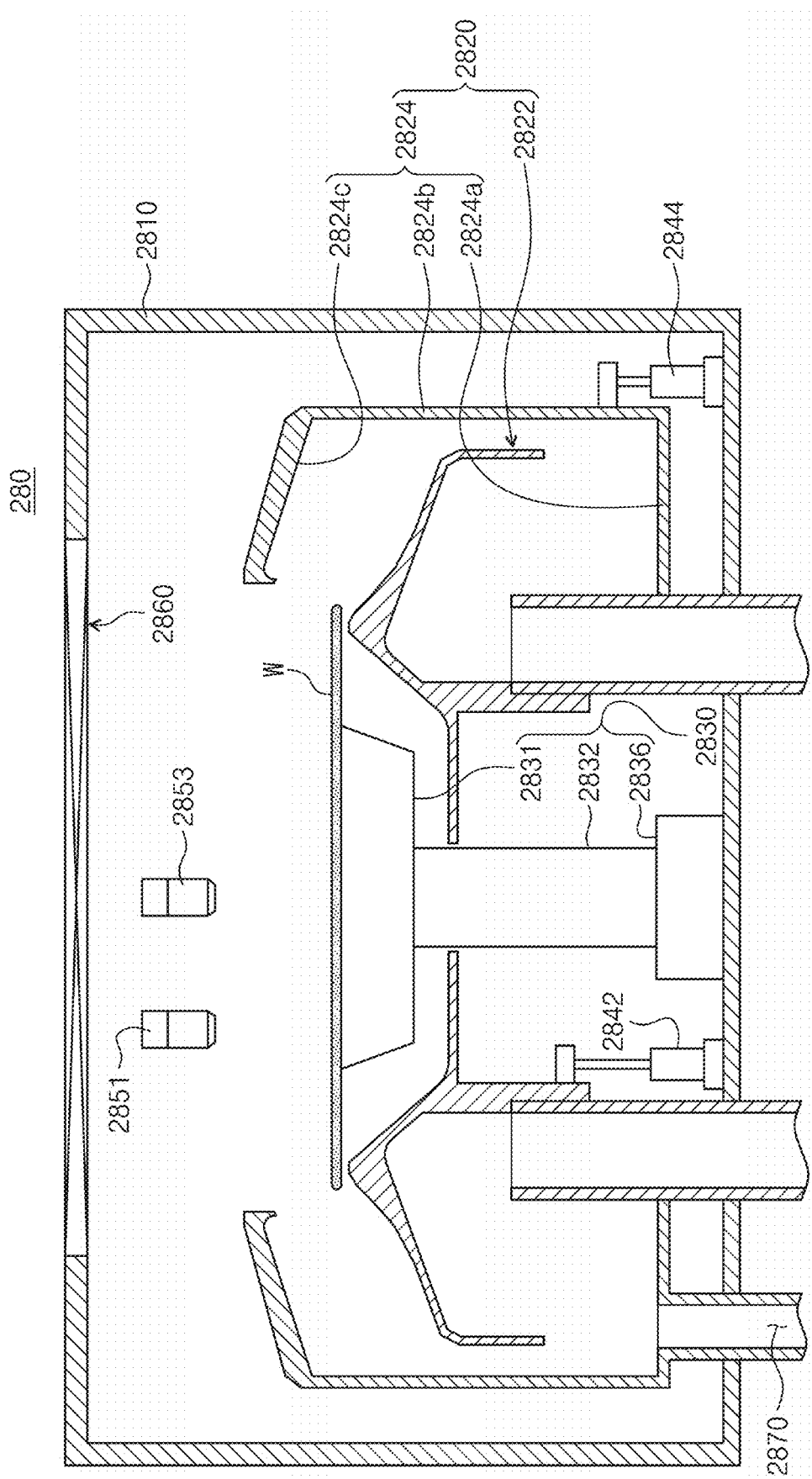
FIG. 7 is a diagram schematically illustrating an example of the liquid treating chamber of FIG. 3.

FIG. 7 is a diagram schematically illustrating an example of the liquid treating chamber of FIG. 3. Referring to FIG. 7, the liquid treating chamber 280 includes a housing 2810, a treatment container 2820, a support unit 2830, and a liquid supply unit 2850.

The housing 2810 provides space therein. The housing 2810 is provided in a generally rectangular parallelepiped shape. An opening (not illustrated) may be formed at one side of the housing 2810. The opening functions as an entrance through which the substrate W is loaded into the internal space or the substrate W is unloaded from the internal space. In addition, in order to selectively seal the entrance, a door (not illustrated) may be installed in an area adjacent to the entrance. The door may seal the inner space by blocking the entrance while the treatment process is performed on the substrate W loaded into the inner space. The treatment container 2820, the support unit 2830, and the liquid supply unit 2640 are disposed within the housing 2810.

The treatment container 2820 may have a treatment space with an open top. The treatment container 2820 may be a bowl having a treatment space. The inner space may be provided to surround the treatment space. The treatment container 2820 may have a cup shape with an open top. The treatment space of the treatment container 2820 may be a space in which the support unit 2830, which will be described later, supports and rotates the substrate W. The treatment space may be a space in which the liquid supply unit 2850 supplies a fluid to treat the substrate W.

According to one example, the treatment container 2820 may include an inner cup 2822 and an outer cup 2824. The outer cup 2824 is provided to surround a circumference of the support unit 2830, and the inner cup 2822 may be located inside the outer cup 2824. Each of the inner cup 2822 and the outer cup 2824 may have an annular ring shape when viewed from the top. A space between the inner cup 2822 and the outer cup 2824 may serve as a recovery path through which the fluid introduced into the treatment space is recovered.

The inner cup 2822 may be provided in a shape surrounding a support shaft 2832 of the support unit 2830, which is to be described later, when viewed from the top. For example, the inner cup 2822 may be provided in a circular plate shape surrounding the support shaft 2832 when viewed from the top. When viewed from the top, the inner cup 2822 may be positioned to overlap an exhaust line 2860 to be described later coupled to the housing 2810.

The inner cup 2822 may have an inner portion and an outer portion. Upper surfaces of the inner portion and the outer portion may be provided to have different angles from each other based on a virtual horizontal line. For example, when viewed from the top, the inner portion may be located to overlap a body 2832 of the support unit 2831 which is to be described later. The inner portion may be located opposite the support shaft 2832. The inner portion may have an upper surface inclined upwardly as it goes away from the support shaft 2832, and the outer portion may extend outwardly from the inner portion. The outer portion may face a downwardly inclined direction as the upper surface moves away from the support shaft 2832. The upper end of the inner portion may coincide with the side end of the substrate W in the vertical direction. According to an example, the point where the outer portion and the inner portion meet may be a position lower than the upper end of the inner portion. The point where the inner portion and the outer portion meet each other may be provided to be round. The outer portion may be combined with the outer cup 2824 to form a recovery path through which a treatment medium is recovered.

The outer cup 2824 may be provided in a cup shape surrounding the support unit 2830 and the inner cup 2822. The outer cup 2824 may include a bottom portion 2824a, a side portion 2824b, and an inclined portion 2824c.

The bottom portion 2824a may have a circular plate shape having a hollow. A recovery line 2870 may be connected to the bottom portion 2824a. The recovery line 2870 may recover the treatment medium supplied onto the substrate W. The treatment medium recovered by the recovery line 2870 may be reused by an external recycling system (not illustrated).

The side portion 2824b may have an annular ring shape surrounding the support unit 2830. The side portion 2824b may extend in a direction perpendicular to the side end of the bottom portion 2824a. The side portion 2824b may extend upwardly from bottom portion 2824a.

The inclined portion 2824c may extend from an upper end of the side portion 2824b toward the central axis of the outer cup 2824. An inner surface of the inclined portion 2824c may be provided to be inclined upwardly to approach the support unit 2830. The inclined portion 2824c may be provided to have a ring shape. During the treatment processing of the substrate W, the upper end of the inclined portion 2824c may be located higher than the substrate W supported by the support unit 2830.

Figure 8:
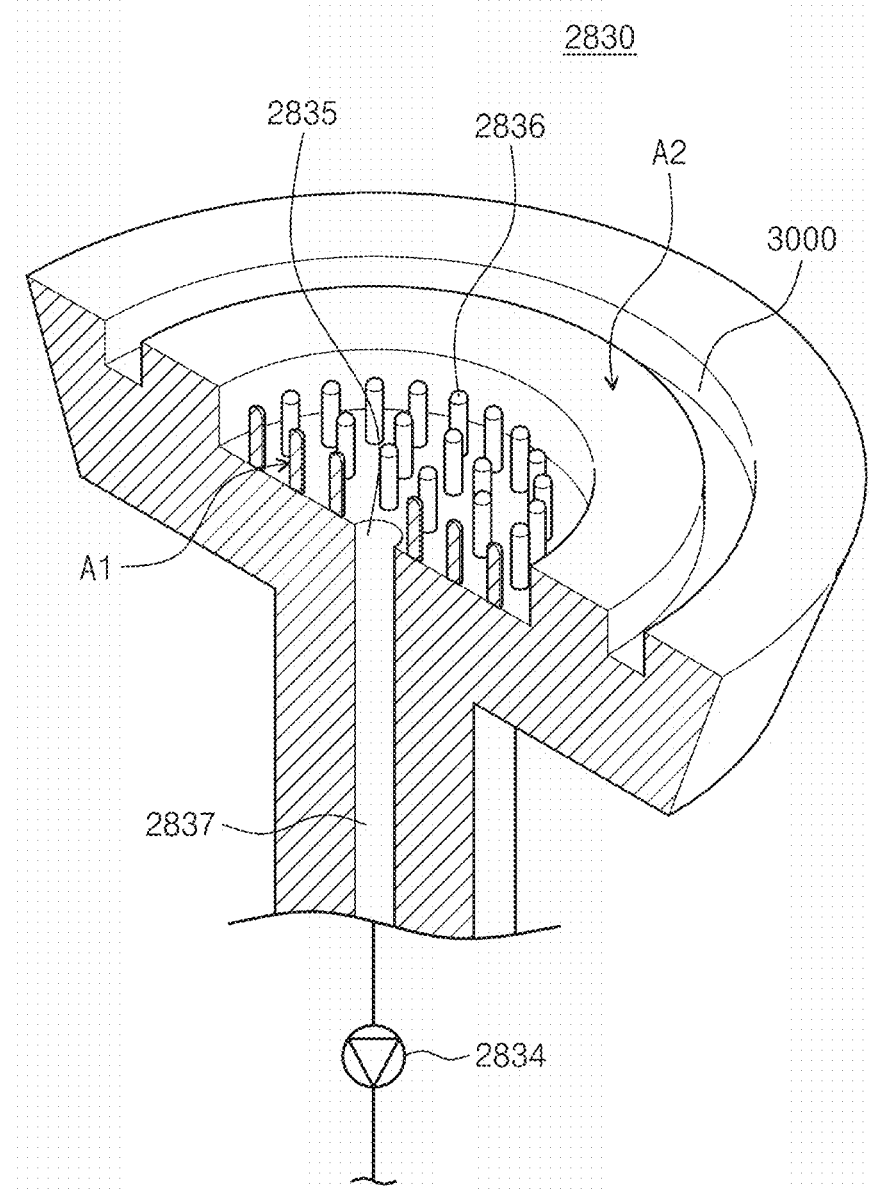
FIG. 8 is a cut perspective view schematically illustrating an example of a support unit of FIG. 7.

FIG. 8 is a cut perspective view schematically illustrating an example of the support unit of FIG. 7. Hereinafter, an exemplary embodiment of the support unit of the present invention will be described in detail with reference to FIG. 8.

The support unit 2830 supports the substrate W in the treatment space and rotates the substrate W. The support unit 2830 may be a chuck that supports and rotates the substrate W. The support unit 2830 may include a body 2831, a support shaft 2832, and a driving unit 2833. The body 2831 may have an upper surface on which the substrate W is seated. The upper surface of the body 2831 is provided in a generally circular shape when viewed from the top. The upper surface of the body 2831 is provided to have a smaller diameter than the substrate W. For example, when viewed from the top, the upper surface of the body 2831 may be provided in a smaller area than the upper surface of the substrate W.

The upper surface of the body 2831 may be provided with a central portion A1 and an edge portion A2. The central portion A1 may be a region including the center of the body 2831. The edge portion A2 may be a region surrounding the central portion A1. For example, the central portion A1 may be a region including a region in which a support protrusion 2836, which will be described later, is formed. For example, the edge portion A2 may be a region from the central portion A1 to the end of the body 2831.

The upper surface of the central portion A1 may be formed lower than the upper surface of the edge portion A2. For example, the central portion A1 may be formed to be stepped with respect to the edge portion A2. A vacuum hole 2835 is formed in the central portion A1. The vacuum hole 2835 may adsorb and fix the substrate W in a vacuum adsorption method. The central portion A1 surrounded by the edge portion A2 may be provided as a decompression space into which the substrate W is adsorbed by the vacuum hole 2835. The support protrusion 2836 for supporting the substrate W may be provided on the upper surface of the central portion A1. An upper end of the support protrusion 2836 may be formed to be round. The upper end of the support protrusion 2836 may contact the lower surface of the substrate W to support the substrate W. The upper end of the support protrusion 2836 may be provided at the same height as the upper surface of the edge portion A2. A plurality of support protrusions 2836 may be provided.

The edge portion A2 provides a seating surface on which the substrate W is seated. The lower surface of the substrate W may be in contact with the upper surface of the edge portion A2, so that the substrate W may be supported. Accordingly, the lower surface of the substrate W is supported by the support protrusion 2836 and the edge portion A2, and the substrate W may be adsorbed and supported due to a depression space formed in the central portion A1.

A groove 3000 is formed in the edge portion A2. The groove 3000 may be provided in a slit shape. The slit 3000 may be provided in a ring shape along the circumference of the edge portion A2. When viewed from a cross-section cut in the width direction of the slit 3000, the slit 3000 is provided with a first side surface 3100 and a second side surface 3200. The second side surface 3200 is located farther from the center of the body 2831 than the first side surface 3100. For example, the first side surface 3100 may be provided at a position closer to the central portion A1, and the second side surface 3200 may be provided at a position farther from the central portion A1 than the first side surface 3100.

According to the exemplary embodiment of the present invention, the first side surface 3100 may be formed parallel to the axial direction of the support shaft 2832 to be described later. The second side surface 3200 may be formed parallel to the axial direction of the support shaft 2832. For example, the bottom surface 3300 may be a surface connecting the first side surface 3100 and the second side surface 3200. When the slit 3000 is viewed from a cross-section cut in the width direction, the slit 3000 may be provided in a shape in which the first side surface 3100, the second side surface 3200, and the bottom surface 3300 are combined to provide an open upper surface with a rectangular shape. An inner space of the slit 3000 is provided as an airflow trapping space in which the external airflow introduced between the substrate W and the upper surface of the edge A2 stays. For example, the external airflow may stay in the inner space formed by combining the first side surface 3100, the second side surface 3200, the bottom surface 3300, and the substrate W seated on the upper surface of the edge portion A2.

Figure 9:
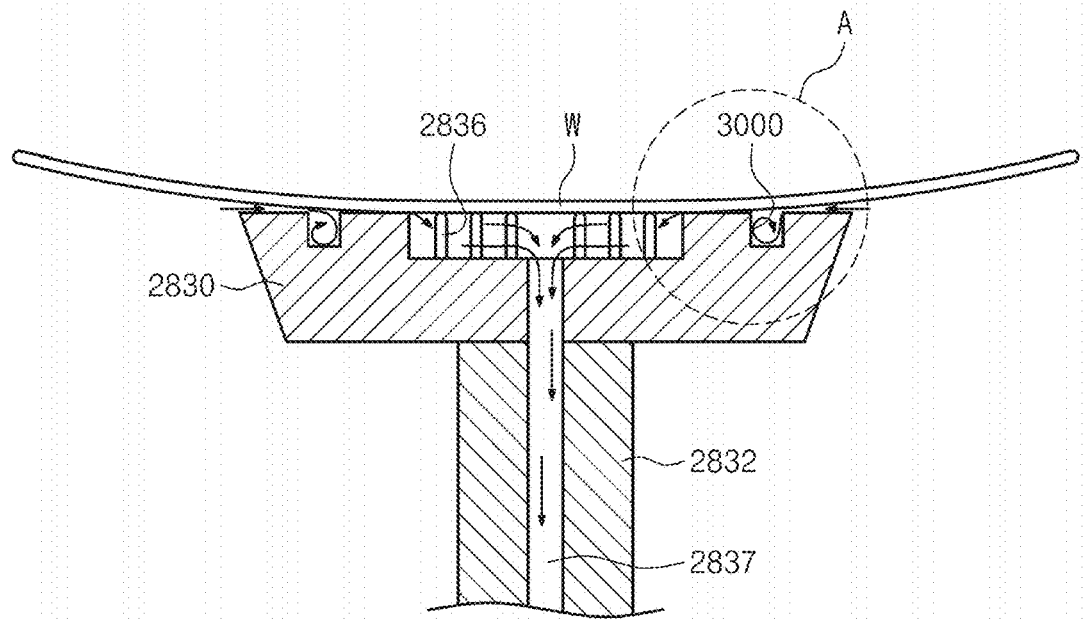
FIG. 9 is a diagram schematically illustrating a state in which an external airflow flows within the support unit of FIG. 7 when viewed from the front.
Figure 10:
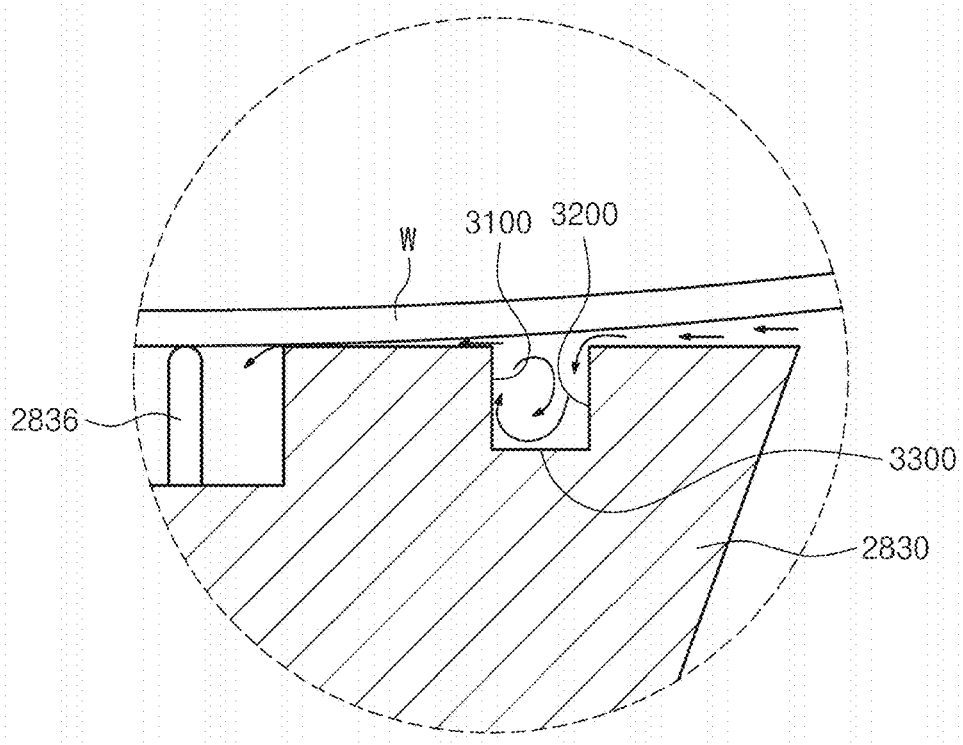
FIG. 10 is a diagram schematically illustrating an enlarged state of part A of FIG. 9.

FIG. 9 is a diagram schematically illustrating a state in which an external airflow flows within the support unit of FIG. 7 when viewed from the front. FIG. 10 is a diagram schematically illustrating an enlarged state of part A of FIG. 9. Hereinafter, a state in which an external airflow flows within the support unit will be described in detail with reference to FIGS. 9 and 10.

An airflow flows inside the housing 2810. For example, an external airflow introduced by an airflow supply unit 2880 to be described later flows inside the housing 2810. When the substrate W in the warped state is seated on the support unit 2830, the lower surface of the substrate W is not in close contact with the edge portion A2. A space spaced apart between the edge portion A2 and the substrate W is generated. Accordingly, the airflow formed in the housing 2810 may be introduced into the spaced space. The airflow introduced into the spaced space flows into the airflow trapping space provided in the slit 3000 formed in the edge portion A2. The airflow forms a vortex by colliding with the first side surface 3100, the second side surface 3200, and the lower surface of the substrate W in the trapping space. The subsequent airflow re-introduced into the spaced space by the formed vortex collides again. Accordingly, the flow velocity of the subsequent airflows introduced into the spaced space decreases. Due to this, it is possible to minimize the reaching of the airflow introduced from the spaced space to the central portion A1. By minimizing the airflow reaching the central portion A1, it is possible to minimize the pressure deviation between the pressure in the vicinity of the center of the substrate W supported by the support protrusion 2836 formed in the central portion A1 and the pressure in the vicinity of the edge of the substrate W supported while being seated at the edge portion A2.

Furthermore, a depression member 2834 provides a negative pressure to the decompression space through the vacuum hole 2835 formed in the central portion A1. The decompression member 2834 provides a negative pressure to the substrate W through the vacuum hole 2835 formed in the central portion A1. The decompression member 2834 provides a negative pressure to the vicinity of the center of the substrate W through the vacuum hole 2835 formed in the central portion A1. Accordingly, the vicinity of the center of the substrate W is provided with a relatively high negative pressure compared to the vicinity of the edge of the substrate W. When the substrate W is seated on the support unit 2830 in the warped state and an external airflow is introduced into the spaced space, the airflow collides with the lower surface of the substrate W in the spaced space, so that force acts in the upper direction with respect to the substrate W. Force is applied in the downward direction in the vicinity of the center of the substrate W, and force is applied in the upward direction in the vicinity of the edge of the substrate W. Accordingly, in the exemplary embodiment of the present invention, by forming the slit 3000 in the edge portion A2, it is possible to minimize the introduction of the external air flow into the central portion A1. The difference in pressure between the vicinity of the center of the substrate W and the vicinity of the edge of the substrate may be minimized Accordingly, when the substrate W in the warped state is seated on the support unit 2830, it is possible to minimize the more deterioration of the warped state of the substrate W.

The support shaft 2832 is coupled with the body 2831. The support shaft 2832 may be coupled to a lower surface of the body 2831. The support shaft 2832 may be provided such that the longitudinal direction thereof heads the vertical direction. The support shaft 2832 is provided to be rotatable by receiving power from the driving unit 2833. The support shaft 2832 rotates by rotation of the driving unit 2833 to rotate the body 2831. The driving unit 2833 may vary the rotation speed of the support shaft 2832. The driving unit 2833 may be a motor providing driving force. However, the present invention is not limited thereto, and may be variously modified to a publicly known device providing driving force. A vacuum flow path 2837 may be formed inside the support shaft 2832. One end of the vacuum flow path 2837 may communicate with the vacuum hole 2835. The other end of the vacuum flow path 2837 may be connected to the decompression member 2834. The decompression member 2834 provides a negative pressure into the vacuum flow path 2837. Accordingly, the lower surface of the substrate W corresponding to the central portion A1 surrounded by the edge portion A2 may be adsorbed.

Referring back to FIG. 7, a lifting unit 2840 is provided in the liquid treating chamber 280. The lifting unit 2840 is disposed within the housing 2810. The lifting unit 2840 adjusts the relative height between the treatment container 2820 and the support unit 2830. The lifting unit 2840 may include a first lifting unit 2842, a second lifting unit 2844, and a third lifting unit 2846. The first lifting unit 2842 may be coupled to the inner cup 2822 of the treatment container 2820. The first lifting unit 2842 linearly moves the inner cup 2822 in the third direction 6. The second lifting unit 2842 may be coupled to the outer cup 2824 of the treatment container 2820. The second lifting unit 2844 linearly moves the outer cup 2824 in the third direction 6. The third lifting unit 2846 may be coupled to the support unit 2830. The third lifting unit 2846 linearly moves the support unit 2830 in the third direction 6. Each of the first lifting unit 2842, the second lifting unit 2844, and the third lifting unit 2846 may be controlled by a controller-3000, which will be described later.

The liquid supply unit 2850 may supply a liquid to the substrate W supported by the support unit 2830. The liquid supply unit 2850 may supply a liquid to the substrate W supported by the support unit 2830. The liquid supplied by the liquid supply unit 2850 to the substrate W may be a coating liquid. For example, the coating liquid may be a photosensitive liquid, such as a photoresist (PR). Also, the liquid supply unit 2850 may supply a pre-wet liquid to the substrate W supported by the support unit 2830. The pre-wet liquid supplied by the liquid supply unit 2850 to the substrate W may be a liquid capable of changing the surface properties of the substrate W. For example, the pre-wet liquid may be a liquid capable of changing the surface properties of the substrate W to hydrophobic properties. For example, the pre-wet liquid may be a thinner.

The liquid supply unit 2850 may include a free wet nozzle 2851, a liquid nozzle 2853, an arm 2855, a rail 2857, and a driver 2859. The pre-wet nozzle 2851 may supply the pre-wet liquid to the substrate W. The pre-wet nozzle 2851 may supply the pre-wet liquid to the substrate W in a stream manner The treatment liquid nozzle 2853 may supply the treatment liquid to the substrate W. The treatment liquid nozzle 2853 may be a coating liquid nozzle that supplies the coating liquid, such as a photoresist. The treatment liquid nozzle 2853 may supply the treatment liquid to the substrate W in a stream manner.

The arm 2855 may support the free wet nozzle 2851 and the treatment liquid nozzle 2853. The free wet nozzle 2851 and the treatment liquid nozzle 2853 may be installed at one end of the arm 2855. The free wet nozzle 2851 and the treatment liquid nozzle 2853 may be respectively installed on the lower surface of one end of the arm 2855. When viewed from the top, the free wet nozzle 2851 and the treatment liquid nozzle 2853 may be arranged in a direction parallel to the longitudinal direction of the rail 2857 to be described later. The other end of the arm 2855 may be coupled to the driver 2859.

The arm 2855 may be moved by the driver 2859. Accordingly, the positions of the free wet nozzle 2851 and the treatment liquid nozzle 2853 installed on the arm 2855 may be changed. A movement direction of the arm 2855 may be guided along the rail 2857 on which the driver 2859 is installed. The rail 2857 may be provided so that the longitudinal direction faces the horizontal direction. For example, the rail 2857 may be provided so that the longitudinal direction faces a direction parallel to the first direction 2. Optionally, the arm 2855 may be rotated by being coupled to a rotational axis whose longitudinal direction faces the third direction 6. The rotational shaft may be rotated by the driver. Accordingly, the positions of the free wet nozzle 2851 and the treatment liquid nozzle 2853 installed on the arm 2855 may be changed.

The exhaust line 2860 may be provided outside the liquid treating chamber 280. The exhaust line 2860 is provided with a decompression unit (not illustrated). The exhaust line 2860 exhausts the atmosphere inside the treatment space by the decompression unit. The exhaust line 2860 may be coupled to the treatment container 2820. Optionally, the exhaust line 2860 may couple to the bottom portion 2824*a* of outer cup 2824. When viewed from the top, the exhaust line 2860 may be located to overlap the inner cup 2822.

The airflow supply unit 2880 supplies an airflow to the inner space of the housing 2810. The airflow supply unit 2880 may supply a descending airflow to the inner space. The airflow supply unit 2880 may supply the temperature and/or humidity-controlled airflow to the internal space. The airflow supply unit 2880 may be installed in the housing 2810. The airflow supply unit 2880 may be installed above the treatment container 2820 and the support unit 2830. The airflow supply unit 2860 may include a fan 2882, an airflow supply line 2884, and a filter 2886. The airflow supply line 2884 may supply an external airflow whose temperature and/or humidity is controlled to the internal space. The filter 2886 may be installed in the airflow supply line 2884. The filter 2886 may remove impurities contained in the external airflow flowing through the airflow supply line 2884. When the fan 2882 is driven, the external airflow supplied by the airflow supply line 2884 may be uniformly transmitted to the inner space.

Referring back to FIGS. 1 to 3, the developing block 20*b* includes a transfer chamber 220, a buffer chamber 240, a heat treatment chamber 260, and a liquid treating chamber 280. The transfer chamber 220, the buffer chamber 240, the heat treatment chamber 260, and the liquid treatment chamber 280 of the developing block 20*b* are provided in the substantially similar structures and arrangements to those of the transfer chamber 220, the buffer chamber 240, the heat treatment chamber 260, and the liquid treating chamber 280 of the coating block 20*a*, and thus a description thereof will be omitted. However, all of the liquid treating chambers 280 of the developing block 20*b* perform a developing process of supplying a developer to the substrate W and developing the substrates in the same manner.

The interface module 30 connects the treating module 20 and the external exposure apparatus 40. The interface module 30 includes an interface frame 320, an additional process chamber 340, an interface buffer 360, and a transfer member 380.

The interface frame 320 provides an inner space. A fan filter unit may be provided at an upper end of the interface frame 320 to form a downdraft in the inner space. The additional process chamber 340, the interface buffer 360, and the transfer member 380 are provided in the inner space of the interface frame 320.

The additional process chamber 340 may perform a predetermined additional process before the substrate W, which has been processed in the coating block 20*a*, is loaded into the exposure apparatus 40. Optionally, the additional process chamber 340 may perform a predetermined additional process before the substrate W, which has been processed in the exposure apparatus 40, is loaded into the developing block 20*b*. According to one example, the additional process is an edge exposure process of exposing an edge region of the substrate W, a top surface cleaning process of cleaning the upper surface of the substrate W, or a lower surface cleaning process of cleaning the lower surface of the substrate W. A plurality of additional process chambers 340 is provided, and may be provided to be stacked on each other. All of the additional process chambers 340 may be provided to perform the same process. Optionally, some of the additional process chambers 340 may be provided to perform different processes.

The interface buffer 360 provides a space in which the substrate W transferred between the coating block 20*a*, the additional process chamber 340, the exposure apparatus 40, and the developing block 20*b* temporarily stays during transfer. A plurality of interface buffers 360 may be provided, and the plurality of interface buffers 360 may be provided to be stacked on each other. According to the example, the additional process chamber 340 may be disposed on one side surface of the transfer chamber 220 based on an extended line in the longitudinal direction and the interface buffer 360 may be disposed on the other side surface.

The transfer member 380 transfers the substrate W between the coating block 20*a*, the additional process chamber 340, the exposure apparatus 40, and the developing block 20*b*. The transfer member 380 may be provided as one or a plurality of robots. According to an example, the transfer member 380 includes a first robot 3820, a second robot 3840, and a third robot 3860. The first robot 3820 transfers the substrate W between the coating block 20*a*, the additional process chamber 340, and the interface buffer 360. The second robot 3840 transfers the substrate W between the interface buffer 360 and the exposure apparatus 40. The third robot 3860 transfers the substrate W between the interface buffer 360 and the developing block 20*b*.

Each of the first robot 3820, the second robot 3840, and the third robot 3860 includes a hand on which the substrate W is placed. The hand may be provided to be movable forwardly and backwardly, rotatable about an axis parallel to the third direction 6, and movable along the third direction 6. The hands of the first robot 3820, the second robot 3840, and the third robot 3860 may all have the same or similar shape as that of the transfer hand 2240 of the transfer robot 224. Optionally, the hand of the robot directly exchanging the substrate W with the cooling plate 2642 of the heat treatment chamber is provided in the same or similar shape as that of the transfer hand 2240 of the transfer robot 224, and the hands of the remaining robots are may be provided in different shapes.

Hereinafter, other examples of the support unit of FIG. 7 will be described. In the exemplary embodiment of the present invention, other configurations except for the body 2831 of the support unit 2830 are provided similarly in other embodiments of the present invention. Accordingly, in the following, descriptions of similarly provided components will be omitted to avoid duplication of description.

Figure 11:
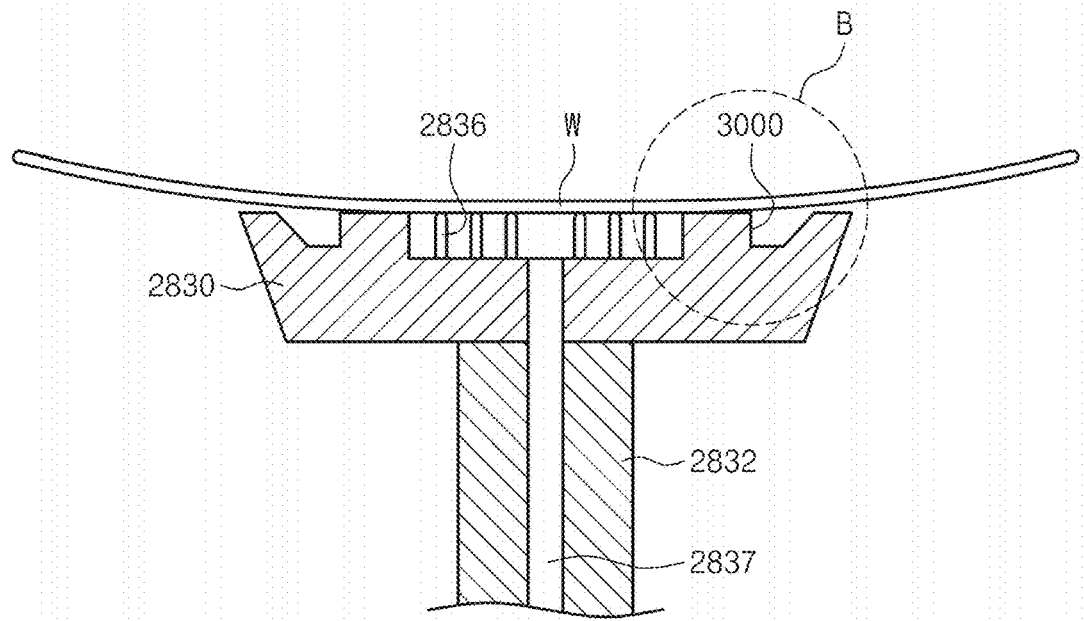
FIG. 11 is a front view of another example of the support unit of FIG. 7.
Figure 12:
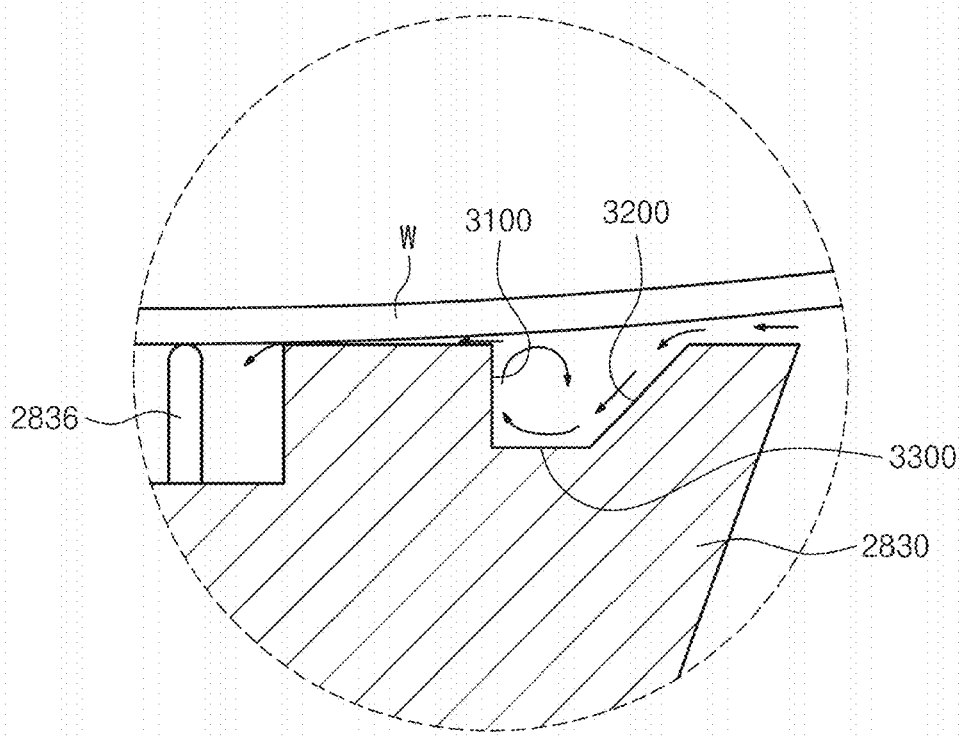
FIG. 12 is a view schematically illustrating an enlarged state of part B of FIG. 11.

FIG. 11 is a front view of another example of the support unit of FIG. 7. FIG. 12 is a view schematically illustrating an enlarged state of part B of FIG. 11.

Referring to FIGS. 11 and 12, the body 2831 may have an upper surface on which the substrate W is seated. The upper surface of the body 2831 is provided in a generally circular shape when viewed from the top. For example, when viewed from the top, the upper surface of the body 2831 may be provided in a smaller area than the upper surface of the substrate W. The upper surface of the body 2831 may be provided with a central portion A1 and an edge portion A2. The central portion A1 may be a region including the center of the body 2831. The edge portion A2 may be a region surrounding the central portion A1. For example, the central portion A1 may be an area including a region in which a support protrusion 2836, which will be described later, is formed. For example, the edge portion A2 may be a region from the central portion A1 to the end of the body 2831.

The upper surface of the central portion A1 may be formed lower than the upper surface of the edge portion A2. For example, the central portion A1 may be formed to be stepped with respect to the edge portion A2. A vacuum hole 2835 is formed in the central portion A1. The vacuum hole 2835 may adsorb and fix the substrate W in a vacuum adsorption method. The central portion A1 surrounded by the edge portion A2 may be provided as a decompression space into which the substrate W is adsorbed by the vacuum hole 2835. The support protrusion 2836 for supporting the substrate W may be provided on the upper surface of the central portion A1. An upper end of the support protrusion 2836 may be formed to be round. The upper end of the support protrusion 2836 may contact the lower surface of the substrate W to support the substrate W. The upper end of the support protrusion 2836 may be provided at the same height as the upper surface of the edge portion A2. A plurality of support protrusions 2836 may be provided.

The edge portion A2 provides a seating surface on which the substrate W is seated. The lower surface of the substrate W may be in contact with the upper surface of the edge portion A2, so that the substrate W may be supported. Accordingly, the lower surface of the substrate W is supported by the support protrusion 2836 and the edge portion A2, and the substrate W may be adsorbed and supported due to a depression space formed in the central portion A1.

A groove 3000 is formed in the edge portion A2. The groove 3000 may be provided in a slit shape. The slit 3000 may be provided in a ring shape along the circumference of the edge portion A2. When viewed from a cross-section cut in the width direction of the slit 3000, the slit 3000 is provided with a first side surface 3100 and a second side surface 3200. The second side surface 3200 is located farther from the center of the body 2831 than the first side surface 3100. For example, the first side surface 3100 may be provided at a position closer to the central portion A1, and the second side surface 3200 may be provided at a position farther from the central portion A1 than the first side surface 3100.

According to the exemplary embodiment of the present invention, the first side surface 3100 may be formed parallel to the axial direction of the support shaft 2832. The second side surface 3200 may be formed to be inclined upwardly in a direction away from the axial direction of the support shaft 2832. According to an example, the bottom surface 3300 may be a surface connecting the first side surface 3100 and the second side surface 3200. When the slit 3000 is viewed from the cross-section cut in the width direction, the first side surface 3100, the slit 3000 may be provided in a trapezoidal shape in which the first side surface 3100, the second side surface 3200, and the bottom surface 3300 are combined with each other to have an open upper surface. An inner space of the slit 3000 is provided as an airflow trapping space in which the external airflow introduced between the substrate W and the upper surface of the edge A2 stays. For example, the external airflow may stay in the inner space formed by combining the first side surface 3100, the second side surface 3200, the bottom surface 3300, and the substrate W seated on the upper surface of the edge portion A2.

Referring to FIG. 12 which is an enlarged view of part B of FIG. 11, an airflow flows inside the housing 2810. For example, an external airflow introduced by an airflow supply unit 2880 to be described later flows inside the housing 2810. When the substrate W in the warped state is seated on the support unit 2830, the lower surface of the substrate W is not in close contact with the edge portion A2. A space spaced apart between the edge portion A2 and the substrate W is generated. Accordingly, the airflow formed in the housing 2810 may be introduced into the spaced space. The airflow introduced into the spaced space flows into the airflow trapping space provided in the slit 3000 formed in the edge portion A2.

According to the exemplary embodiment of the present invention, the second side surface 3200 is formed to be inclined upwardly in the direction away from the axial direction of the support shaft 2832, so that the airflow introduced into the spaced space may easily flow into the airflow trapping space. Accordingly, the airflow introduced into the trapping space collides with the first side surface 3100 and the lower surface of the substrate W in the trapping space to form a vortex. That is, since the second side surface 3200 is formed to be inclined, the inflow of airflow into the trapping space is increased, thereby actively forming a vortex inside the airflow trapping space.

The subsequent airflow re-introduced into the spaced space by the formed vortex collides again. Accordingly, the flow velocity of the subsequent airflows introduced into the spaced space decreases. Due to this, it is possible to minimize the reaching of the airflow introduced from the spaced space to the central portion A1. By minimizing the airflow reaching the central portion A1, it is possible to minimize the pressure deviation between the pressure in the vicinity of the center of the substrate W supported by the support protrusion 2836 formed in the central portion A1 and the pressure in the vicinity of the edge of the substrate W supported while being seated at the edge portion A2.

Furthermore, a depression member 2834 provides a negative pressure to the decompression space through the vacuum hole 2835 formed in the central portion A1. The decompression member 2834 provides a negative pressure to the substrate W through the vacuum hole 2835 formed in the central portion A1. The decompression member 2834 provides a negative pressure to the vicinity of the center of the substrate W through the vacuum hole 2835 formed in the central portion A1. Accordingly, the vicinity of the center of the substrate W is provided with a relatively high negative pressure compared to the vicinity of the edge of the substrate W. When the substrate W is seated on the support unit 2830 in the warped state and an external airflow is introduced into the spaced space, the airflow collides with the lower surface of the substrate W in the spaced space, so that force acts in the upper direction with respect to the substrate W. Force is applied in the downward direction in the vicinity of the center of the substrate W, and force is applied in the upward direction in the vicinity of the edge of the substrate W.

Accordingly, in the exemplary embodiment of the present invention, by forming the slit 3000 in the edge portion A2, it is possible to minimize the introduction of the external air flow into the central portion A1. The difference in pressure between the vicinity of the center of the substrate W and the vicinity of the edge of the substrate may be minimized Accordingly, when the substrate W in the warped state is seated on the support unit 2830, it is possible to minimize the more deterioration of the warped state of the substrate W.

Figure 13:
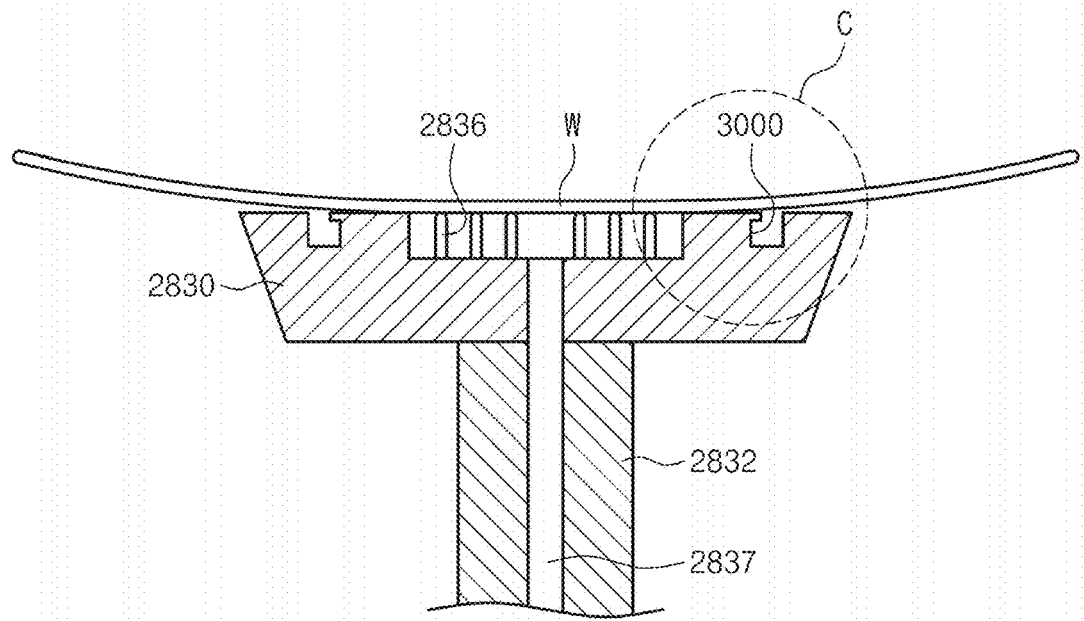
FIG. 13 is a front view of another example of the support unit of FIG. 7.
Figure 14:
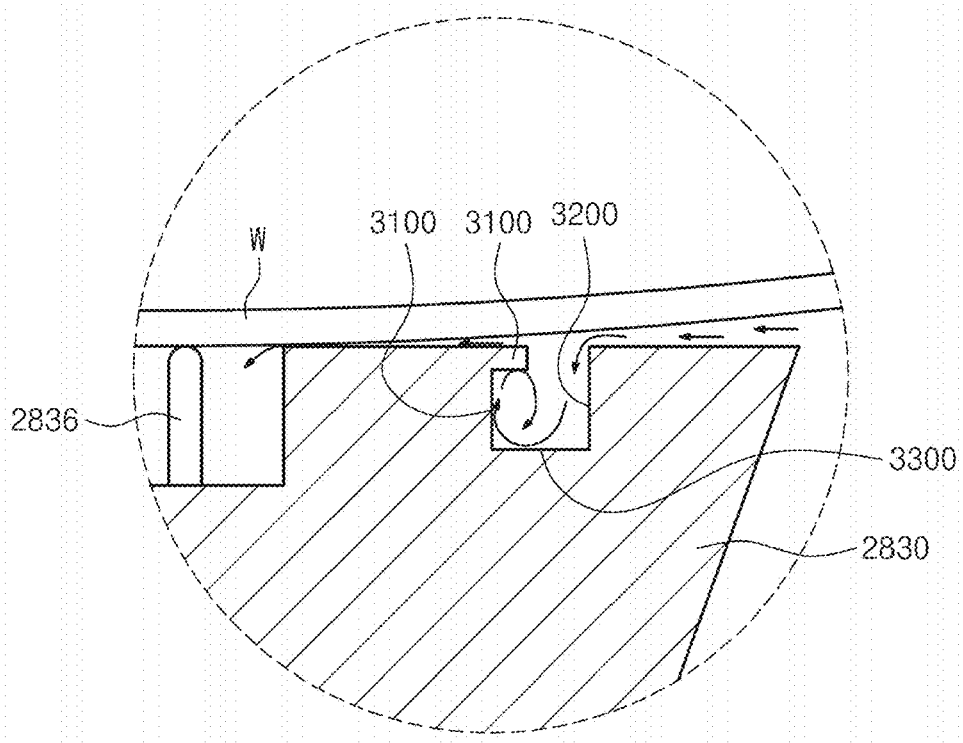
FIG. 14 is a diagram schematically illustrating an enlarged state of part C of FIG. 13.

FIG. 13 is a front view of another example of the support unit of FIG. 7. FIG. 14 is a diagram schematically illustrating an enlarged state of part C of FIG. 13.

Referring to FIGS. 13 and 14, the body 2831 may have an upper surface on which the substrate W is seated. The upper surface of the body 2831 is provided in a generally circular shape when viewed from the top. For example, when viewed from the top, the upper surface of the body 2831 may be provided in a smaller area than the upper surface of the substrate W. The upper surface of the body 2831 may be provided with a central portion A1 and an edge portion A2. The central portion A1 may be a region including the center of the body 2831. The edge portion A2 may be a region surrounding the central portion A1. For example, the central portion A1 may be an area including a region in which a support protrusion 2836, which will be described later, is formed. For example, the edge portion A2 may be a region from the central portion A1 to the end of the body 2831.

The upper surface of the central portion A1 may be formed lower than the upper surface of the edge portion A2. For example, the central portion A1 may be formed to be stepped with respect to the edge portion A2. A vacuum hole 2835 is formed in the central portion A1. The vacuum hole 2835 may adsorb and fix the substrate W in a vacuum adsorption method. The central portion A1 surrounded by the edge portion A2 may be provided as a decompression space into which the substrate W is adsorbed by the vacuum hole 2835. The support protrusion 2836 for supporting the substrate W may be provided on the upper surface of the central portion A1. An upper end of the support protrusion 2836 may be formed to be round. The upper end of the support protrusion 2836 may contact the lower surface of the substrate W to support the substrate W. The upper end of the support protrusion 2836 may be provided at the same height as the upper surface of the edge portion A2. A plurality of support protrusions 2836 may be provided.

The edge portion A2 provides a seating surface on which the substrate W is seated. The lower surface of the substrate W may be in contact with the upper surface of the edge portion A2, so that the substrate W may be supported. Accordingly, the lower surface of the substrate W is supported by the support protrusion 2836 and the edge portion A2, and the substrate W may be adsorbed and supported due to a depression space formed in the central portion A1.

A groove 3000 is formed in the edge portion A2. The groove 3000 may be provided in a slit shape. The slit 3000 may be provided in a ring shape along the circumference of the edge portion A2. When viewed from a cross-section cut in the width direction of the slit 3000, the slit 3000 is provided with a first side surface 3100 and a second side surface 3200. The second side surface 3200 is located farther from the center of the body 2831 than the first side surface 3100. For example, the first side surface 3100 may be provided at a position closer to the central portion A1, and the second side surface 3200 may be provided at a position farther from the central portion A1 than the first side surface 3100.

According to the exemplary embodiment of the present invention, the first side surface 3100 may be formed parallel to the axial direction of the support shaft 2832. A protrusion 3400 protruding in a direction away from the axis of the support shaft 2832 may be formed at an upper end of the first side surface 3100. A protrusion 3400 protruding in a direction away from the center of the body 2831 may be formed at the upper end of the first side surface 3100. The second side surface 3200 may be formed parallel to the axial direction of the support shaft 2832. According to an example, the bottom surface 3300 may be a surface connecting the first side surface 3100 and the second side surface 3200.

An inner space of the slit 3000 is provided as an airflow trapping space in which the external airflow introduced between the substrate W and the upper surface of the edge A2 stays. For example, the external airflow may stay in the inner space formed by combining the first side surface 3100, the second side surface 3200, the bottom surface 3300, the protrusion 3400, and the substrate W seated on the upper surface of the edge portion A2 with each other.

Referring to FIG. 14 which is an enlarged view of part C of FIG. 13, an airflow flows inside the housing 2810. For example, an external airflow introduced by an airflow supply unit 2880 to be described later flows inside the housing 2810. When the substrate W in the warped state is seated on the support unit 2830, the lower surface of the substrate W is not in close contact with the edge portion A2. A space spaced apart between the edge portion A2 and the substrate W is generated. Accordingly, the airflow formed in the housing 2810 may be introduced into the spaced space. The airflow introduced into the spaced space flows into the airflow trapping space provided in the slit 3000 formed in the edge portion A2.

According to the exemplary embodiment of the present invention, since the protrusion 3400 is formed on the upper end of the first side surface 3100, it is possible to minimize the discharge of the airflow introduced into the spaced space from the inside of the airflow trapping space to the central portion A1. That is, the airflow introduced into the airflow trapping space may not move to the central portion A1, but may collide with the protrusion 3400 again to stay inside the airflow trapping space. As the airflow that collides with the protrusion 3400 again collides with a subsequently introduced airflow, a vortex may be actively formed in the airflow trapping space. Accordingly, the flow velocity of the subsequent airflows introduced into the spaced space decreases. Due to this, it is possible to minimize the reaching of the airflow introduced from the spaced space to the central portion A1. By minimizing the airflow reaching the central portion A1, it is possible to minimize the pressure deviation between the pressure in the vicinity of the center of the substrate W supported by the support protrusion 2836 formed in the central portion A1 and the pressure in the vicinity of the edge of the substrate W supported while being seated at the edge portion A2.

Furthermore, a depression member 2834 provides a negative pressure to the decompression space through the vacuum hole 2835 formed in the central portion A1. The decompression member 2834 provides a negative pressure to the substrate W through the vacuum hole 2835 formed in the central portion A1. The decompression member 2834 provides a negative pressure to the vicinity of the center of the substrate W through the vacuum hole 2835 formed in the central portion A1. Accordingly, the vicinity of the center of the substrate W is provided with a relatively high negative pressure compared to the vicinity of the edge of the substrate W. When the substrate W is seated on the support unit 2830 in the warped state and an external airflow is introduced into the spaced space, the airflow collides with the lower surface of the substrate W in the spaced space, so that force acts in the upper direction with respect to the substrate W. Force is applied in the downward direction in the vicinity of the center of the substrate W, and force is applied in the upward direction in the vicinity of the edge of the substrate W.

Accordingly, in the exemplary embodiment of the present invention, by forming the slit 3000 in the edge portion A2, it is possible to minimize the introduction of the external air flow into the central portion A1. The difference in pressure between the vicinity of the center of the substrate W and the vicinity of the edge of the substrate may be minimized Accordingly, when the substrate W in the warped state is seated on the support unit 2830, it is possible to minimize the more deterioration of the warped state of the substrate W.

Figure 15:
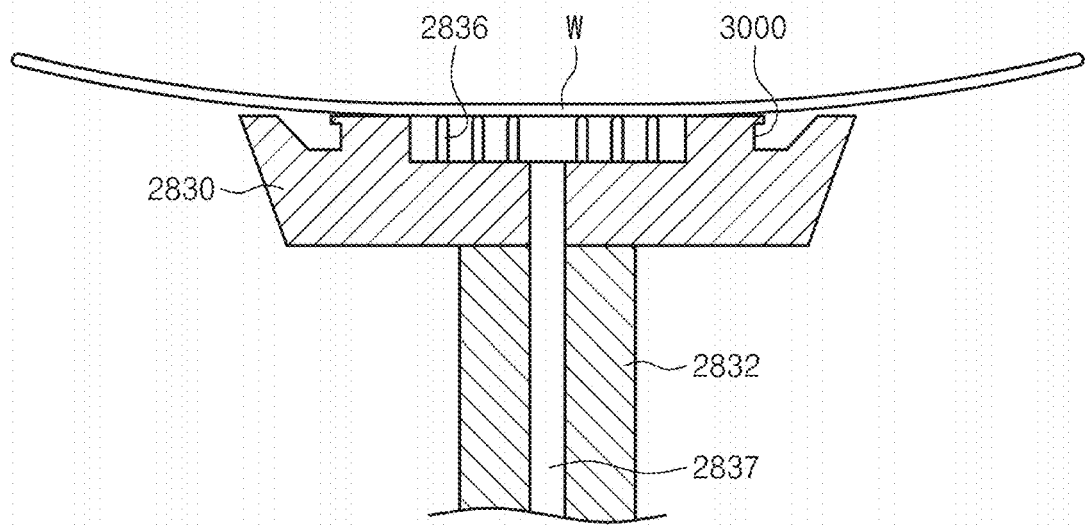
FIG. 15 is a front view of another example of the support unit of FIG. 7.

FIG. 15 is a front view of another example of the support unit of FIG. 7. Referring to FIG. 15, the body 2831 may have an upper surface on which the substrate W is seated. The upper surface of the body 2831 is provided in a generally circular shape when viewed from the top. For example, when viewed from the top, the upper surface of the body 2831 may be provided in a smaller area than the upper surface of the substrate W. The upper surface of the body 2831 may be provided with a central portion A1 and an edge portion A2. The central portion A1 may be a region including the center of the body 2831. The edge portion A2 may be a region surrounding the central portion A1. For example, the central portion A1 may be an area including a region in which a support protrusion 2836, which will be described later, is formed. For example, the edge portion A2 may be a region from the central portion A1 to the end of the body 2831.

The upper surface of the central portion A1 may be formed lower than the upper surface of the edge portion A2. For example, the central portion A1 may be formed to be stepped with respect to the edge portion A2. A vacuum hole 2835 is formed in the central portion A1. The vacuum hole 2835 may adsorb and fix the substrate W in a vacuum adsorption method. The central portion A1 surrounded by the edge portion A2 may be provided as a decompression space into which the substrate W is adsorbed by the vacuum hole 2835. The support protrusion 2836 for supporting the substrate W may be provided on the upper surface of the central portion A1. An upper end of the support protrusion 2836 may be formed to be round. The upper end of the support protrusion 2836 may contact the lower surface of the substrate W to support the substrate W. The upper end of the support protrusion 2836 may be provided at the same height as the upper surface of the edge portion A2. A plurality of support protrusions 2836 may be provided.

The edge portion A2 provides a seating surface on which the substrate W is seated. The lower surface of the substrate W may be in contact with the upper surface of the edge portion A2, so that the substrate W may be supported. Accordingly, the lower surface of the substrate W is supported by the support protrusion 2836 and the edge portion A2, and the substrate W may be adsorbed and supported due to a depression space formed in the central portion A1.

A groove 3000 is formed in the edge portion A2. The groove 3000 may be provided in a slit shape. The slit 3000 may be provided in a ring shape along the circumference of the edge portion A2. When viewed from a cross-section cut in the width direction of the slit 3000, the slit 3000 is provided with a first side surface 3100 and a second side surface 3200. The second side surface 3200 is located farther from the center of the body 2831 than the first side surface 3100. For example, the first side surface 3100 may be provided at a position closer to the central portion A1, and the second side surface 3200 may be provided at a position farther from the central portion A1 than the first side surface 3100.

According to the exemplary embodiment of the present invention, the first side surface 3100 may be formed parallel to the axial direction of the support shaft 2832. A protrusion 3400 protruding in a direction away from the axis of the support shaft 2832 may be formed at an upper end of the first side surface 3100. A protrusion 3400 protruding in a direction away from the center of the body 2831 may be formed at the upper end of the first side surface 3100. The second side surface 3200 may be formed to be inclined upwardly in a direction away from the axial direction of the support shaft 2832. According to an example, the bottom surface 3300 may be a surface connecting the first side surface 3100 and the second side surface 3200.

An inner space of the slit 3000 is provided as an airflow trapping space in which the external airflow introduced between the substrate W and the upper surface of the edge A2 stays. For example, the external airflow may stay in the inner space formed by combining the first side surface 3100, the second side surface 3200, the bottom surface 3300, the protrusion 3400, and the substrate W seated on the upper surface of the edge portion A2 with each other.

Referring to FIG. 14 which is an enlarged view of part C of FIG. 13, an airflow flows inside the housing 2810. For example, an external airflow introduced by an airflow supply unit 2880 to be described later flows inside the housing 2810. When the substrate W in the warped state is seated on the support unit 2830, the lower surface of the substrate W is not in close contact with the edge portion A2. A space spaced apart between the edge portion A2 and the substrate W is generated. Accordingly, the airflow formed in the housing 2810 may be introduced into the spaced space. The airflow introduced into the spaced space flows into the airflow trapping space provided in the slit 3000 formed in the edge portion A2.

According to the exemplary embodiment of the present invention, the second side surface 3200 is formed to be inclined upwardly in the direction away from the axial direction of the support shaft 2832, so that the airflow introduced into the spaced space may easily flow into the airflow trapping space. Further, since the protrusion 3400 is formed on the upper end of the first side surface 3100, it is possible to minimize the discharge of the airflow introduced into the spaced space from the inside of the airflow trapping space to the central portion A1. That is, the airflow introduced into the airflow trapping space may not move to the central portion A1, but may collide with the protrusion 3400 again to stay inside the airflow trapping space. As the airflow that collides with the protrusion 3400 again collides with a subsequently introduced airflow, a vortex may be actively formed in the airflow trapping space. Accordingly, the flow velocity of the subsequent airflows introduced into the spaced space decreases. Due to this, it is possible to minimize the reaching of the airflow introduced from the spaced space to the central portion A1. By minimizing the airflow reaching the central portion A1, it is possible to minimize the pressure deviation between the pressure in the vicinity of the center of the substrate W supported by the support protrusion 2836 formed in the central portion A1 and the pressure in the vicinity of the edge of the substrate W supported while being seated at the edge portion A2.

Furthermore, a depression member 2834 provides a negative pressure to the decompression space through the vacuum hole 2835 formed in the central portion A1. The decompression member 2834 provides a negative pressure to the substrate W through the vacuum hole 2835 formed in the central portion A1. The decompression member 2834 provides a negative pressure to the vicinity of the center of the substrate W through the vacuum hole 2835 formed in the central portion A1. Accordingly, the vicinity of the center of the substrate W is provided with a relatively high negative pressure compared to the vicinity of the edge of the substrate W. When the substrate W is seated on the support unit 2830 in the warped state and an external airflow is introduced into the spaced space, the airflow collides with the lower surface of the substrate W in the spaced space, so that force acts in the upper direction with respect to the substrate W. Force is applied in the downward direction in the vicinity of the center of the substrate W, and force is applied in the upward direction in the vicinity of the edge of the substrate W.

Accordingly, in the exemplary embodiment of the present invention, by forming the slit 3000 in the edge portion A2, it is possible to minimize the introduction of the external air flow into the central portion A1. The difference in pressure between the vicinity of the center of the substrate W and the vicinity of the edge of the substrate may be minimized Accordingly, when the substrate W in the warped state is seated on the support unit 2830, it is possible to minimize the more deterioration of the warped state of the substrate W.

Figure 16:
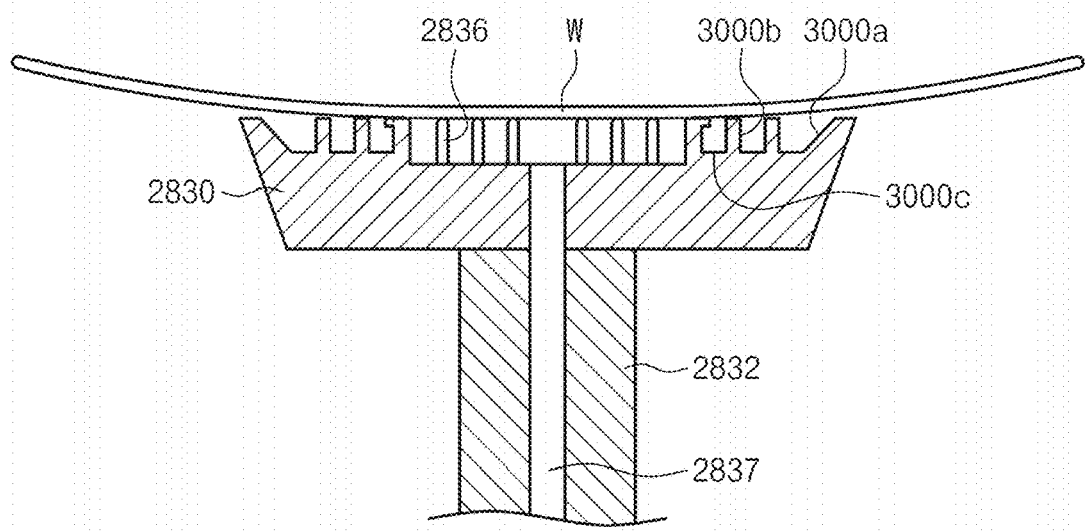
FIG. 16 is a front view of another example of the support unit of FIG. 7.

FIG. 16 is a front view of another example of the support unit of FIG. 7. Referring to FIG. 16, the body 2831 may have an upper surface on which the substrate W is seated. The upper surface of the body 2831 is provided in a generally circular shape when viewed from the top. For example, when viewed from the top, the upper surface of the body 2831 may be provided in a smaller area than the upper surface of the substrate W. The upper surface of the body 2831 may be provided with a central portion A1 and an edge portion A2. The central portion A1 may be a region including the center of the body 2831. The edge portion A2 may be a region surrounding the central portion A1. For example, the central portion A1 may be an area including a region in which a support protrusion 2836, which will be described later, is formed. For example, the edge portion A2 may be a region from the central portion A1 to the end of the body 2831.

The upper surface of the central portion A1 may be formed lower than the upper surface of the edge portion A2. For example, the central portion A1 may be formed to be stepped with respect to the edge portion A2. A vacuum hole 2835 is formed in the central portion A1. The vacuum hole 2835 may adsorb and fix the substrate W in a vacuum adsorption method. The central portion A1 surrounded by the edge portion A2 may be provided as a decompression space into which the substrate W is adsorbed by the vacuum hole 2835. The support protrusion 2836 for supporting the substrate W may be provided on the upper surface of the central portion A1. An upper end of the support protrusion 2836 may be formed to be round. The upper end of the support protrusion 2836 may contact the lower surface of the substrate W to support the substrate W. The upper end of the support protrusion 2836 may be provided at the same height as the upper surface of the edge portion A2. A plurality of support protrusions 2836 may be provided.

The edge portion A2 provides a seating surface on which the substrate W is seated. The lower surface of the substrate W may be in contact with the upper surface of the edge portion A2, so that the substrate W may be supported. Accordingly, the lower surface of the substrate W is supported by the support protrusion 2836 and the edge portion A2, and the substrate W may be adsorbed and supported due to a depression space formed in the central portion A1.

A groove 3000 is formed in the edge portion A2. The groove 3000 may be provided in a slit shape. The slit 3000 may be provided in a ring shape along the circumference of the edge portion A2. A plurality of slits 3000 may be provided. The plurality of slits 3000 may be provided to be spaced apart from each other in a direction from the edge portion A2 toward the center portion A1.

Hereinafter, for convenience of description, a case in which a plurality of slits 3000 is provided as three will be described as an example. However, the present invention is not limited thereto and the plurality of slits 3000 may be provided as two or a natural number of 4 or more.

The plurality of slits 3000 may be provided in different shapes. The plurality of slits 3000 may include a first slit 3000a, a second slit 3000b, and a third slit 3000c. The first slit 3000a, the second slit 3000b, and the third slit 3000c may be sequentially spaced apart from each other in a direction from the edge portion A2 of the body toward the center portion A1. The first slit 3000a may be located closer to the outer end of the edge portion A2 than the second slit 3000b and the third slit 3000c. The second slit 3000b may be located closer to the outer end of the edge portion A2 than the third slit 3000c.

When the first slit 3000a is viewed from a cross-section cut in the width direction, the first slit 3000a is provided with a first side surface 3100a of the first slit 3000a and a second side surface 3200a of the first slit 3000a. The second side surface 3200a is located farther from the center of the body 2831 than the first side surface 3100a. For example, the first side surface 3100a may be provided at a position closer to the central portion A1, and the second side surface 3200a may be provided at a position farther from the central portion A1 than the first side surface 3100a.

When the second slit 3000b is viewed from the cross-section cut in the width direction, the second slit 3000b is provide with a first side surface 3100b of the second slit 3000b and a second side surface 3200b of the second slit 3000b. The second side surface 3200b is located farther from the center of the body 2831 than the first side surface 3100b. For example, the first side surface 3100b may be provided at a position closer to the central portion A1, and the second side surface 3200b may be provided at a position farther from the central portion A1 than the first side surface 3100b.

When the third slit 3000c is viewed from a cross-section cut in the width direction, the third slit 3000c is provided with a first side surface 3100c of the third slit 3000c and a second side surface 3200c of the third slit 3000c. The second side surface 3200c is located farther from the center of the body 2831 than the first side surface 3100c. For example, the first side surface 3100c may be provided at a position closer to the central portion A1, and the second side surface 3200c may be provided at a position farther from the central portion A1 than the first side surface 3100c.

According to the exemplary embodiment of the present invention, the first side surface 3100a of the first slit 3000a may be formed parallel to the axial direction of the support shaft 2832. The second side surface 3200a of the first slit 3000a may be formed to be inclined upwardly in a direction away from the axial direction of the support shaft 2832. According to an example, the bottom surface 3300a of the first slit 3000a may be a surface connecting the first side surface 3100a and the second side surface 3200a. When the first slit 3000a is viewed from the cross-section cut in the width direction, the first slit 3000a may be provided in a trapezoidal shape in which the first side surface 3100a, the second side surface 3200a, and the bottom surface 3300a are combined to have an open upper surface. The inner space of the first slit 3000a is provided as a first trapping space in which the external air flow introduced between the substrate W and the upper surface of the edge portion A2 stays. For example, the external airflow may stay in the inner space formed by combining the first side surface 3100a, the second side surface 3200a, the bottom surface 3300a, and the substrate W seated on the upper surface of the edge part A2 with each other.

The first side surface 3100b of the second slit 3000b may be formed parallel to the axial direction of the support shaft 2832. The second side surface 3200b of the second slit 3000*b* may be formed parallel to the axial direction of the support shaft 2832. According to an example, the bottom surface 3300*b* of the second slit 3000*b* may be a surface connecting the first side surface 3100*b* and the second side surface 3200*b*. When the second slit 3000*b* is viewed from a cross-section cut in the width direction, the second slit 3000*b* may be provided in a quadrangular shape in which the first side surface 3100*b*, the second side surface 3200*b*, and the bottom surface 3300*b* are combined with each other to have an open upper surface. The inner space of the second slit 3000*b* is provided as a second trapping space in which the airflow introduced from the first trapping space stays. For example, the inner space formed by combining the first side surface 3100*b*, the second side surface 3200*b*, the bottom surface 3300*b*, and the substrate W seated on the upper surface of the edge part A2 with each other may be provided as a space in which the airflow introduced from the first trapping space stays.

The first side surface 3100*c* of the third slit 3000 may be formed parallel to the axial direction of the support shaft 2832. A protrusion 3400 protruding in a direction away from the axis of the support shaft 2832 may be formed on the upper end of the first side surface 3100*c*. The protrusion 3400 protruding in a direction away from the center of the body 2831 may be formed on the upper end of the first side surface 3100*c*. The second side surface 3200*c* of the third slit 3000*c* may be formed parallel to the axial direction of the support shaft 2832. According to an example, the bottom surface 3300*c* of the third slit 3000*c* may be a surface connecting the first side surface 3100*c* and the second side surface 3200*c*. The inner space of the third slit 3000*c* is provided as a third trapping space in which the airflow introduced from the second trapping space stays. For example, the inner space formed by combining the first side surface 3100*c*, the second side surface 3200*c*, the bottom surface 3300*c*, the protrusion 3400, and the substrate W seated on the upper surface of the edge portion A2 with each other may be provided as a space in which the airflow introduced from the second trapping space stays.

An airflow flows inside the housing 2810. For example, an external airflow introduced by an airflow supply unit 2880 to be described later flows inside the housing 2810. When the substrate W in the warped state is seated on the support unit 2830, the lower surface of the substrate W is not in close contact with the edge portion A2. A space spaced apart between the edge portion A2 and the substrate W is generated. Accordingly, the airflow formed in the housing 2810 may be introduced into the spaced space. The airflow introduced into the spaced space flows into the airflow trapping space provided in the slit 3000 formed in the edge portion A2.

According to the exemplary embodiment of the present invention, the second side surface 3200*a* of the first slit 3000*a* is formed to be inclined upwardly in the direction away from the axial direction of the support shaft 2832, so that the airflow introduced into the spaced space may be easily introduced into the first trapping space. Accordingly, the airflow introduced into the first trapping space collides with the first side surface 3100*a* of the first slit 3000*a* and the lower surface of the substrate W in the first trapping space to form a vortex. That is, the second side surface 3200*a* forming the first trapping space into which the external airflow is first introduced is formed to be inclined, so that the introduction of the airflow into the first trapping space increases, thereby actively forming the vortex in the first trapping space.

The subsequent airflow re-introduced into the spaced space by the formed vortex collides again. Accordingly, the flow velocity of the subsequent airflows introduced into the spaced space decreases. For this reason, it is possible to minimize the reach of the airflow introduced from the spaced space to the second trapping space formed in the second slit 3000*b*.

A vortex is secondarily formed in the second trapping space formed by the second slit 3000*b*. Accordingly, it is possible to minimize the flow of the airflow into the third trapping space formed by the third slit 3000*c* disposed adjacent to the central portion A1. By forming the protrusion 3400 on the upper end of the first side surface 3100*c* of the third slit 3000*c*, it is possible to minimize the leakage of the air flow introduced into the third trapping space from the inside of the third trapping space to the central portion A1. That is, the airflow introduced into the airflow trapping space may not move to the central portion A1, but may collide with the protrusion 3400 again to stay inside the airflow trapping space. As the airflow that collides with the protrusion 3400 again collides with a subsequently introduced airflow, a vortex may be actively formed in the airflow trapping space.

For this reason, it is possible to minimize the reaching of the airflow introduced from the spaced space to the central portion A1 while sequentially flowing through the first trapping space, the second trapping space, and the third trapping space. By minimizing the airflow reaching the central portion A1, it is possible to minimize the pressure deviation between the pressure in the vicinity of the center of the substrate W supported by the support protrusion 2836 formed in the central portion A1 and the pressure in the vicinity of the edge of the substrate W supported while being seated at the edge portion A2.

Furthermore, a depression member 2834 provides a negative pressure to the decompression space through the vacuum hole 2835 formed in the central portion A1. The decompression member 2834 provides a negative pressure to the substrate W through the vacuum hole 2835 formed in the central portion A1. The decompression member 2834 provides a negative pressure to the vicinity of the center of the substrate W through the vacuum hole 2835 formed in the central portion A1. Accordingly, the vicinity of the center of the substrate W is provided with a relatively high negative pressure compared to the vicinity of the edge of the substrate W. When the substrate W is seated on the support unit 2830 in the warped state and an external airflow is introduced into the spaced space, the airflow collides with the lower surface of the substrate W in the spaced space, so that force acts in the upper direction with respect to the substrate W. Force is applied in the downward direction in the vicinity of the center of the substrate W, and force is applied in the upward direction in the vicinity of the edge of the substrate W.

Accordingly, in the exemplary embodiment of the present invention, by forming the plurality of slits 3000 in the edge portion A2, it is possible to minimize the introduction of the external air flow into the central portion A1. The difference in pressure between the vicinity of the center of the substrate W and the vicinity of the edge of the substrate may be minimized Accordingly, when the substrate W in the warped state is seated on the support unit 2830, it is possible to minimize the more deterioration of the warped state of the substrate W.

Unlike the exemplary embodiment of the present invention, the plurality of slits 3000 may be provided in combination in various shapes. When the slit 3000 is viewed from a cross-section cut in the width direction, the slit 3000 may have a first side surface 3100 and a second side surface 3200 located farther from the center of the body 2831 than the first side surface 3100. The plurality of slits 3000 may have any one of a first shape, a second shape, a third shape, and a fourth shape. For example, in the first shape, the first side surface 3100 and the second side surface 3200 may be formed parallel to the axial direction of the support shaft 2832. In the second shape, the first side surface 3100 may be formed parallel to the axial direction of the support shaft 2832, and the second side surface 3200 may be formed to be inclined upwardly in a direction far away from the axial direction of the support shaft 2832. In the third shape, the first side surface 3100 and the second side surface 3200 are formed parallel to the axial direction of the support shaft 2832, and a protrusion 3400 protruding in the direction away from the center of the support shaft 2832 may be further formed on the upper end of the first side surface 3100. In the fourth shape, the first side surface 3100 is formed parallel to the axial direction of the support shaft 2832, and the second side surface 3200 is formed to be inclined upwardly in a direction away from the axial direction of the support shaft 2832, and a protrusion 3400 protruding in a direction away from the center of the support shaft 2832 may be further formed on the upper end of the first side surface 3100. The plurality of slits 3000 may be provided in various shapes other than the above-described shape of the slit 3000.

Figure 17:
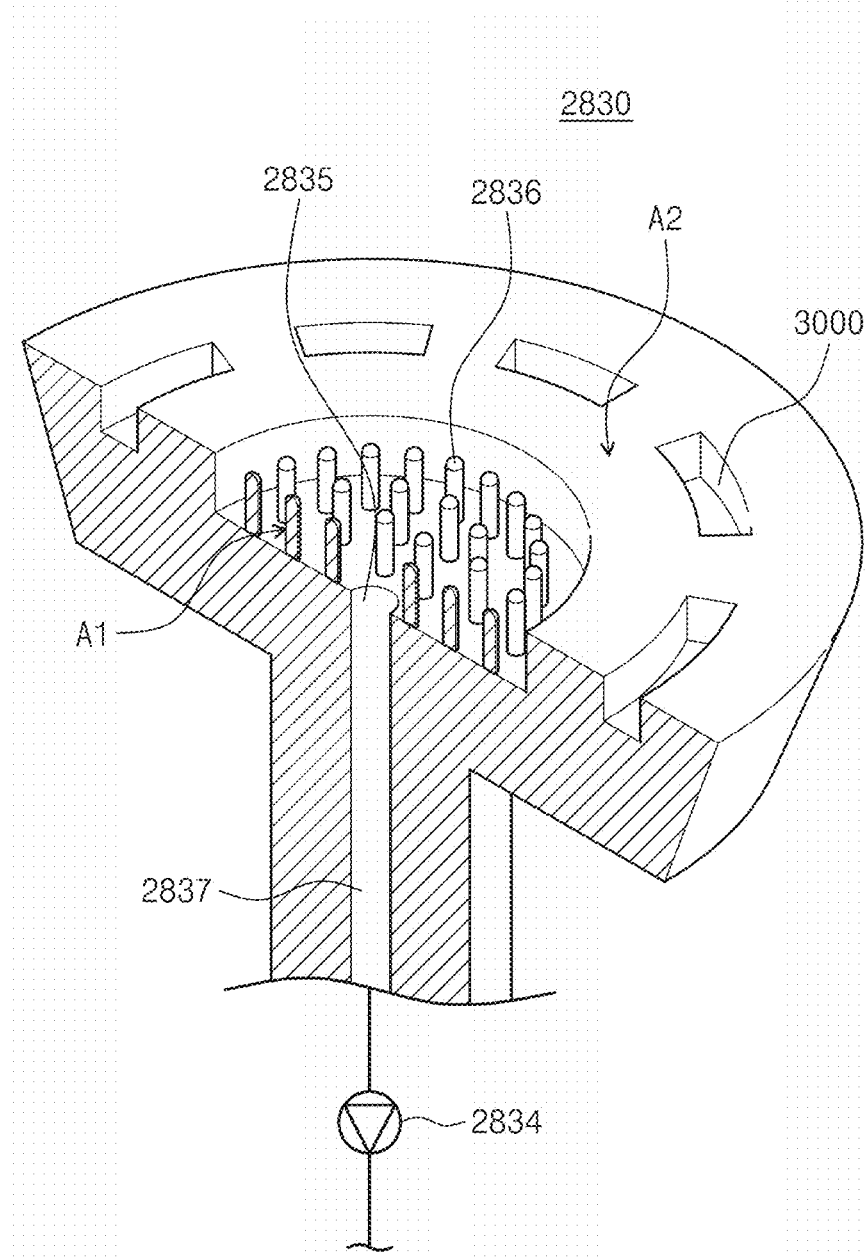
FIG. 17 is a cut perspective view schematically illustrating another example of the support unit of FIG. 7.

FIG. 17 is a cut perspective view schematically illustrating another example of the support unit of FIG. 7. In the exemplary embodiment, the present invention has been described based on the case where the groove 3000 is provided in a slit shape and provided in a ring shape along the circumference of the edge portion A2 as an example. However, unlike this, the slits 3000 may generally have a circular arc shape, and a plurality of slits may be provided. Referring to FIG. 17, the slit 3000 may be provided on the edge portion A2. A plurality of slits 3000 may be provided. The plurality of slits 3000 may have a generally arc shape. The plurality of slits 3000 having the arc shape may share the center of the body 2831. The plurality of slits 3000 may be provided to be spaced apart from each other in the circumferential direction. The shape of the plurality of slits 3000 may be variously modified and provided as in the above-described exemplary embodiments.

In the exemplary embodiments, the present invention has been described based on the case where the bottom surface 3300 connecting the first side surface 3100 and the second side surface 3200 is provided as an example, but is not limited thereto. For example, the first side surface 3100 and the second side surface 3200 may share one side with each other. For example, the slit 3000 may be provided in a generally triangular shape when viewed from the front according to the combination of the first side 3100 and the second side 3200 with each other.

In addition, in the exemplary embodiments, the present invention has been described based on the case where the support protrusion 2836 is provided on the upper surface of the support unit 2830 as an example, but is not limited thereto. Each of the central portion A1 and the edge portion A2 may be provided as a seating surface on which the substrate W is seated. For example, the upper surface of the central portion A1 and the upper surface of the edge portion A2 may be in contact with the lower surface of the substrate W.

The foregoing detailed description illustrates the present invention. Further, the above content shows and describes the exemplary embodiment of the present invention, and the present invention can be used in various other combinations, modifications, and environments. That is, changes or modifications are possible within the scope of the concept of the invention disclosed herein, the scope equivalent to the written disclosure, and/or within the scope of skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating apparatus, comprising:
a treatment container having a treatment space therein;
a support unit configured to support and rotate a substrate in the treatment space; and
a liquid supply unit configured to supply a liquid on the substrate,
wherein the support unit includes
a body on which the substrate is seated; and
a support shaft coupled to the body,
an upper surface of the body has a central portion including a center of the body and an edge portion surrounding the central portion, the edge portion extending from the central portion to an end of the body, and
the central portion defines a vacuum hole, and the edge portion defines a groove, wherein the upper surface of the body has a smaller area than the substrate when viewed from a top view,
an upper surface of the central portion is lower than an upper surface of the edge portion, a support protrusion configured to support the substrate is on the upper surface of the central portion, and
at least a portion of the upper surface of the edge portion and an upper end of the support protrusion are at a same height.

2. The substrate treating apparatus of claim 1, wherein the groove has a slit shape.

3. The substrate treating apparatus of claim 2, wherein the slit shape groove has a ring shape along a circumference of the edge portion.

4. The substrate treating apparatus of claim 3, wherein the slit shape groove has a first side surface and a second side surface located farther from the center of the body than the first side surface when viewed from a cross-section cut in a width direction of the slit shape groove.

5. The substrate treating apparatus of claim 4, wherein the first side surface and the second side surface are parallel to an axial direction of the support shaft.

6. The substrate treating apparatus of claim 4, wherein the first side surface is parallel to an axial direction of the support shaft, and
the second side surface is inclined upwardly in a direction away from the axial direction of the support shaft.

7. The substrate treating apparatus of claim 5, wherein in the slit shape groove, a protrusion protruding in a direction away from the center of the body is on an upper portion of the first side surface.

8. The substrate treating apparatus of claim 4, wherein the slip shape groove comprises a plurality of slits, the plurality of slits are spaced apart from each other in a direction to the central portion in the edge portion, and the plurality of slits have different shapes from each other.

9. The substrate treating apparatus of claim 8, wherein the slit shape groove has any one of:

a first shape in which the first side surface and the second side surface are parallel to an axial direction of the support shaft;

a second shape in which the first side surface is parallel to the an axial direction of the support shaft, and the second side surface is inclined upwardly in a direction away from the axial direction of the support shaft;

a third shape in which the first side surface and the second side surface are parallel to the an axial direction of the support shaft, and a protrusion that protrudes in a direction away from the a center of the support shaft is on an upper end of the first side surface; and a fourth shape in which the first side surface is parallel to the an axial direction of the support shaft, and the second side surface is inclined upwardly in the a direction away from the axial direction of the support shaft, and a protrusion that protrudes in a direction away from a center of the support shaft is on the an upper end of the first side surface.

10. The substrate treating apparatus of claim 1, wherein a portion surrounded by the edge portion is a decompression space in which the substrate is adsorbed by the vacuum hole, and an inner space of the groove is an airflow trapping space in which an external airflow introduced between the substrate and the upper surface of the edge portion stays.

11. A support unit for supporting and rotating a substrate, the support unit comprising:

a body on which the substrate is seated; and a support shaft coupled to the body with a vacuum flow path therein, wherein an upper surface of the body has a central portion including a center of the body and an edge portion surrounding the central portion, the edge portion extending from the central portion to an end of the body, a vacuum hole communicating with one end of the vacuum flow path is in a center of the central portion, and a ring-shaped groove is along a circumference of the edge portion, and the ring-shaped groove has a first side surface and a second side surface located farther from the center of the body than the first side surface when viewed from a cross-section cut in a width direction of the ring-shaped slit, wherein in the ring-shaped groove, a protrusion protruding in a direction away from the center of the body is on an upper portion of the first side surface.

12. The support unit of claim 11, wherein the first side surface and the second side surface are parallel to an axial direction of the support shaft.

13. The support unit of claim 11, wherein the first side surface is parallel to an axial direction of the support shaft, and the second side surface is inclined upwardly in a direction away from the axial direction of the support shaft.

14. The support unit of claim 11, wherein the upper surface of the body has a smaller area than the substrate when viewed from a top view.

15. The support unit of claim 14, wherein an upper surface of the central portion is lower than an upper surface of the edge portion and includes a support protrusion configured to support the substrate, and the upper surface of the edge portion and an upper end of the support protrusion are at a same height with respect to ground.

16. The support unit of claim 15, wherein the ring-shaped groove comprises a plurality of slits, the plurality of slits are spaced apart from each other in a direction to the central portion in the edge portion, and the plurality of slits have different shapes from each other.

17. A substrate treating apparatus, comprising:

a housing having an inner space;

a treatment container positioned within the inner space and having a treatment space;

a support unit configured to support and rotate a substrate in the treatment space;

a liquid supply unit configured to supply a liquid onto the substrate; and an airflow supply unit coupled to an upper surface of the housing and configured to supply gas forming a downward airflow to the inner space, wherein the support unit includes a body on which the substrate is seated; and a support shaft coupled to the body with a vacuum flow path therein, and an upper surface of the body has a central portion including a center of the body and an edge portion surrounding the central portion, a vacuum hole communicating with one end of the vacuum flow path is in a center of the central portion, an upper surface of the central portion is lower than an upper surface of the edge portion and includes a support protrusion configured to support the substrate, a ring-shaped groove is along a circumference of the edge portion, and the ring-shaped groove has a first side surface and a second side surface located farther from the center of the body than the first side surface when viewed from a cross-section cut in a width direction of the ring-shaped groove.

18. The substrate treating apparatus of claim 17, wherein in the ring-shaped groove, a protrusion protruding in a direction away from the center of the body is on an upper portion of the first side surface.

* * * * *